(12) United States Patent
Nishio et al.

(10) Patent No.: US 8,338,958 B2
(45) Date of Patent: Dec. 25, 2012

(54) SEMICONDUCTOR DEVICE AND MANUFACTURING METHOD THEREOF

(75) Inventors: Taichi Nishio, Osaka (JP); Hiroshige Hirano, Nara (JP); Yukitoshi Ota, Osaka (JP)

(73) Assignee: Panasonic Corporation, Osaka (JP)

( * ) Notice: Subject to any disclaimer, the term of this patent is extended or adjusted under 35 U.S.C. 154(b) by 204 days.

(21) Appl. No.: 12/843,481

(22) Filed: Jul. 26, 2010

(65) Prior Publication Data

US 2010/0283130 A1  Nov. 11, 2010

Related U.S. Application Data

(63) Continuation of application No. PCT/JP2009/003433, filed on Jul. 22, 2009.

(30) Foreign Application Priority Data

Sep. 26, 2008  (JP) .................................. 2008-248773

(51) Int. Cl.
*H01L 29/40* (2006.01)
(52) U.S. Cl. .................. 257/774; 257/E21.597; 438/667
(58) Field of Classification Search .................. 257/774, 257/E21.597; 438/667
See application file for complete search history.

(56) References Cited

U.S. PATENT DOCUMENTS

| | | | | |
|---|---|---|---|---|
| 2002/0105087 | A1* | 8/2002 | Forbes et al. ................. | 257/774 |
| 2005/0009329 | A1 | 1/2005 | Tanida et al. | |
| 2005/0017338 | A1 | 1/2005 | Fukazawa | |
| 2005/0048698 | A1* | 3/2005 | Yamaguchi .................... | 438/109 |
| 2005/0221601 | A1 | 10/2005 | Kawano | |
| 2005/0233581 | A1 | 10/2005 | Soejima et al. | |
| 2006/0001174 | A1* | 1/2006 | Matsui .......................... | 257/774 |
| 2006/0148250 | A1* | 7/2006 | Kirby ............................ | 438/667 |
| 2007/0085189 | A1 | 4/2007 | Sunohara et al. | |
| 2008/0079121 | A1* | 4/2008 | Han .............................. | 257/621 |
| 2008/0136038 | A1* | 6/2008 | Savastiouk et al. ............ | 257/774 |
| 2008/0153286 | A1* | 6/2008 | Sunohara et al. ............. | 438/667 |
| 2008/0265430 | A1 | 10/2008 | Ishihara | |
| 2008/0272498 | A1* | 11/2008 | Yu et al. ........................ | 257/774 |
| 2010/0244251 | A1* | 9/2010 | Torazawa et al. ............. | 257/741 |

FOREIGN PATENT DOCUMENTS

| | | |
|---|---|---|
| JP | 2002-289623 | 10/2002 |
| JP | 2006-134973 | 5/2006 |
| JP | 2007-005401 | 1/2007 |
| JP | 2007-005403 | 1/2007 |
| JP | 2007-095743 | 4/2007 |
| JP | 2008-091628 | 4/2008 |
| JP | 2008-109106 | 5/2008 |
| JP | 2008-300718 | 12/2008 |
| WO | WO 2005/043622 A1 | 5/2005 |

* cited by examiner

*Primary Examiner* — Steven J Fulk
(74) *Attorney, Agent, or Firm* — McDermott Will & Emery LLP

(57) ABSTRACT

A semiconductor device includes: a semiconductor substrate having a first surface as a surface on which an element is formed, and a second surface opposite to the first surface; a through hole formed so as to extend through the semiconductor substrate from the first surface to the second surface; an insulating film formed on an inner wall of the through hole; and a conductive portion formed in a space surrounded by the insulating film in the through hole. The insulating film continuously extends on the inner wall of the through hole and on the second surface.

23 Claims, 19 Drawing Sheets

102

103

SEMICONDUCTOR DEVICE AND MANUFACTURING METHOD THEREOF

CROSS-REFERENCE TO RELATED APPLICATION

This is a continuation of PCT International Application PCT/JP2009/003433 filed on Jul. 22, 2009, which claims priority to Japanese Patent Application No. 2008-248773 filed on Sep. 26, 2008. The disclosures of these applications including the specifications, the drawings, and the claims are hereby incorporated by reference in its entirety.

BACKGROUND

The present disclosure relates to semiconductor devices having through electrodes, and manufacturing methods thereof.

In recent years, stacked semiconductor devices, which are formed by stacking a plurality of semiconductor chips on top of one another, have been developed to increase the performance of semiconductor devices and the integration level thereof. In many conventional stacked semiconductor devices, semiconductor chips are stacked on top of one another via relay substrates such as interposers, and are electrically connected by wire bonding. Such conventional stacked semiconductor devices have high interconnect resistance due to a long interconnect length, which limits an increase in operating speed. Moreover, the need to extend wires increases the overall size of the semiconductor devices, which limits reduction in size.

As a solution to these problems is proposed a method for connecting semiconductor chips via through electrodes. The through electrodes are formed by forming through holes in semiconductor chips and filling the through holes with a metal or a conductive resin. This configuration enables stacked semiconductor chips to be connected together with the smallest gap therebetween. This configuration can reduce the interconnect length, and thus the interconnect resistance as compared to the case where the semiconductor chips are connected by wire bonding, whereby the high speed operation can be achieved. Since this configuration does not require the region for extending the wires, the overall size of the stacked semiconductor device is determined only by the size of the semiconductor chips. The overall height of the stacked semiconductor device can also be reduced by thinning each semiconductor chip that is stacked. Thus, the overall size of the stacked semiconductor device can be reduced as compared to the conventional structures.

FIG. 21 is a cross-sectional view showing the structure around a through electrode in a conventional semiconductor device 300 disclosed in Japanese Published Patent Application No. 2005-12023. As shown in FIG. 21, a semiconductor substrate 301 of the semiconductor device 300 has a first surface 302a as a surface on which an integrated circuit is formed, and a second surface 302b that is opposite to the first surface 302a. A through electrode 305 is formed in the semiconductor substrate 301 so as to extend from the first surface 302a to the second surface 302b. An insulating film 308 is formed around an exposed portion of the through electrode 305 on the second surface 302b in order to electrically isolate the through electrode 305 from the semiconductor substrate 301. The semiconductor device 300 of FIG. 21 is manufactured by the following method.

First, an integrated circuit is formed over the first surface 302a of the semiconductor substrate 301, and a through hole is formed from the first surface 302a side to an intermediate depth in the semiconductor substrate 301. Note that an electrode 311 is formed on the first surface 302a of the semiconductor substrate 301 with an insulating film 303 therebetween, and a passivation film 310 is formed so as to cover the electrode 311. The through hole is formed so as to extend through the insulating film 303 and the electrode 311.

Next, an insulating film 304 is formed on the inner wall of the through hole from the first surface 302a side, and an outer layer portion 309, such as a barrier layer and a seed layer, is formed as appropriate on the insulating film 304. Thereafter, a conductive portion is buried in the through hole to form the through electrode 305. The through electrode 305 has a first protruding portion 307 that overlaps the electrode 311.

Then, the surface opposite to the first surface 302a of the semiconductor substrate 301 is subjected to mechanical polishing/grinding, chemical polishing/grinding, or the like in order to thin the semiconductor substrate 301 until the insulating film 304 at the bottom of the through electrode 305 is exposed. Subsequently, this opposite surface (the surface opposite to the first surface 302a of the semiconductor substrate 301) is etched by a known technique such as dry etching, wet etching, or the like to expose the bottom of the through electrode 305 having its sidewall covered by the insulating film 304. A second protruding portion 307 is formed in this manner.

Thereafter, the insulating film 308 is formed on the entire opposite surface (hereinafter referred to as the second surface 302b) other than the second protruding portion 307 of the through electrode 305. The insulating film 308 located on the sides of the second protruding portion 307 are removed by mechanical or chemical polishing/grinding, whereby the through electrode 305 is completed.

SUMMARY

A problem of the conventional semiconductor device 300 is that unintended electrical short-circuits occur between the through electrode 305 and the semiconductor substrate 301 on the second surface 302b side of the semiconductor substrate 301, causing malfunctions of active elements located on the first surface 302a side of the semiconductor substrate 301.

In view of the above problem, it is an object of the present disclosure to increase reliability of insulation between each through electrode and a semiconductor substrate on the back side of a substrate (on a surface on which no circuit is formed) in a semiconductor device having through electrodes.

In order to achieve the above object, the inventors analyzed and examined the conventional semiconductor device 300, and have found out the following fact. When forming a three-dimensional integrated circuit by connecting chips together or connecting chips with interposers or the like via through electrodes, it is important to reliably insulate each through electrode from the back surface portion of a substrate located around the through electrode. Thus, forming an insulating film on the back surface of the substrate having exposed through electrodes has been considered to be an effective way to implement such reliable insulation. In the conventional semiconductor device 300, the insulating film 308 is formed on the back surface of the substrate, namely on the second surface 302b. However, due to poor reliability of the insulating film 308, unintended electrical short-circuits occur between the through electrode 305 and the semiconductor substrate 301 on the second surface 302b side of the semiconductor substrate 301.

More specifically, in the conventional semiconductor device 300, a process such as mechanical or chemical polishing/grinding or etching is used to expose the bottom portion of the through electrode 305 to form the second protruding portion 307. This process tends to cause damage, such as cracking or fracture, chipping, and delamination, to the insulating film 304 formed on the sidewall of the through electrode 305, and in particular to the exposed insulating film 304 on the sidewall of the second protruding portion 307. Since the insulating film 308, which is formed on the second surface 302a around the second protruding portion 307, is a film separate from the insulating film 304 formed on the sidewall of the through electrode 305 (that is, the insulating film 308 is not continuous with the insulating film 304), sufficient insulation may not be obtained at the boundary between the insulating films 308 and 304. This causes unintended electrical short-circuits between the through electrode 305 and the semiconductor substrate 301, resulting in malfunctions of the active elements located on the first surface 302a side.

The present disclosure was developed based on the above findings. More specifically, a semiconductor device according to the present disclosure includes: a semiconductor substrate having a first surface as a surface on which an element is formed, and a second surface opposite to the first surface; a through hole formed so as to extend through the semiconductor substrate from the first surface to the second surface; an insulating film formed on an inner wall of the through hole; and a conductive portion (i.e., a through electrode) formed in a space surrounded by the insulating film in the through hole, wherein the insulating film continuously extends on the inner wall of the through hole and on the second surface.

Note that in the semiconductor device of the present disclosure, the element that is formed on the first surface side of the semiconductor substrate is an active element having an impurity diffusion layer such as, e.g., a diode and a transistor.

According to the semiconductor device of the present disclosure, the insulating film formed on the second surface of the semiconductor substrate (the back surface of the substrate) is continuous with the insulating film formed on the inner wall of the through hole (these insulating films form a continuous film). This can reliably reduce or eliminate the possibility of short-circuits between the semiconductor substrate and the through electrode exposed from the back surface of the substrate, as compared to conventional structures in which these insulating films are separate films and there is a joint therebetween.

In the semiconductor device of the present disclosure, a diameter of the through hole may decrease in a direction from the first surface toward the second surface, and the through hole may have a smallest diameter at the second surface. This can increase the contact area between the through electrode and an interconnect or an electrode pad on the first surface side of the semiconductor substrate (on the front side of the substrate), whereby contact resistance can be reduced.

In the semiconductor device of the present disclosure, the through hole may have a larger diameter only in a portion near the first surface than in a remaining portion. This can implement a space-efficient arrangement of multiple ones of the through electrode without increasing the area that is occupied by the through electrodes in the semiconductor substrate, and can reduce the contact resistance between the through electrode and the interconnect or the electrode pad.

In the semiconductor device of the present disclosure, the through hole may have a larger diameter on the second surface side than on the first surface side.

In the semiconductor device of the present disclosure, the insulating film may continuously extend on the inner wall of the through hole and on the first surface.

In the semiconductor device of the present disclosure, it is preferable that the insulating film be formed by a first insulating film and a second insulating film, and that the second insulating film continuously extend on the inner wall of the through hole and on the second surface. In this case, the insulating film on the inner wall of the through hole is formed by the first insulating film and the second insulating film. Thus, even if the through hole has a high aspect ratio, the insulating film, which covers the entire inner wall of the through hole, can be reliably formed by forming the first insulating film from the first surface side (from the front side of the substrate) and forming the second insulating film from the second surface side (from the back side of the substrate). This can further increase reliability of insulation between the through electrode and the semiconductor substrate. In this case, the first insulating film may continuously extend on the inner wall of the through hole and on the first surface. The conductive portion may be formed by a first conductive portion and a second conductive portion. In this case, even if the through hole has a high aspect ratio, the through electrode having a smaller void can be formed by forming the first conductive portion from the first surface side (from the front side of the substrate) and forming the second conductive portion from the second surface side (from the back side of the substrate), whereby reliability of the through electrode can be increased. Note that the first conductive portion may be formed in a space surrounded by the first insulating film in the through hole.

In the semiconductor device of the present disclosure, the conductive portion may protrude from the second surface side.

In the semiconductor device of the present disclosure, an interlayer insulating film may be formed over the first surface of the semiconductor substrate, and the through hole may be formed also in the interlayer insulating film.

In the semiconductor device of the present disclosure, an interconnect may be formed over the first surface of the semiconductor substrate, and the conductive portion and the interconnect may be connected together.

A method for manufacturing a semiconductor device according to the present disclosure includes the steps of (a) forming a through hole so that the through hole extends through a semiconductor substrate that has a first surface as a surface on which an element is formed, and a second surface opposite to the first surface; (b) forming an insulating film so that the insulting film continuously extends on an inner wall of the through hole and on the second substrate; and (c) forming a conductive portion (i.e., a through electrode) in a space surrounded by the insulating film in the through hole.

According to the method of the present disclosure, the insulating film formed on the second surface of the semiconductor substrate (the back surface of the substrate) is continuous with the insulating film formed on the inner wall of the through hole (i.e., these insulating films form a continuous film). This can reliably reduce or eliminate the possibility of short-circuits between the semiconductor substrate and the through electrode exposed from the back surface of the substrate, as compared to conventional structures in which these insulating films are separate films and there is a joint therebetween.

In the method of the present disclosure, the step (b) may include the step of forming the insulating film on the second surface and on the inner wall of the through hole from the second surface side. In this case, the step (a) may include the step of forming the through hole so that a diameter of the through hole decreases in a direction from the first surface toward the second surface, and that the through hole has a smallest diameter at the second surface. This can increase the contact area between the through electrode and an interconnect or an electrode pad on the first surface side of the semiconductor substrate (the front side of the substrate), and thus can reduce contact resistance. In this case, the step (a) may include the step of forming the through hole so that the through hole has a larger diameter only in a portion near the first surface than in a remaining portion. This can implement a space-efficient arrangement of multiple ones of the through electrode without increasing the area that is occupied by the through electrodes in the semiconductor substrate, and can reduce the contact resistance between the through electrode and the interconnect or the electrode pad. The step (a) may include the steps of (a1) forming, from the first surface side, the through hole so that the through hole extends to an intermediate depth in the semiconductor substrate, and (a2) thinning the semiconductor substrate from the second surface side to expose a bottom of the through hole, and the method may further include the steps of: (d) burying a nonmetal material in the through hole between the steps (a1) and (a2); and (e) removing the nonmetal material from the through hole between the steps (a2) and (b). This can reduce or eliminate the possibility that an interconnect material and/or an interlayer film material may enter the through hole when forming an interconnect layer on the first surface after forming the through hole from the first surface side. In this case, the nonmetal material is simultaneously ground or the like together with the semiconductor substrate, when thinning the semiconductor substrate from the second surface side so as to expose the bottom of the through hole. This can also avoid or reduce problems such as chipping in the through hole.

In the method of the present disclosure, the step (a) may include the steps of: (a1) forming, from the first surface side, the through hole so that the through hole extends to an intermediate depth in the semiconductor substrate, and (a2) thinning the semiconductor substrate from the second surface side to expose a bottom of the through hole, the method may further include the step of (f) forming, from the first surface side, a first insulating film on the first surface and on the inner wall of the through hole between the steps (a1) and (a2), and the step (b) may include the step of forming, from the second surface side, a second insulating film on the second surface and on the inner wall of the through hole so that the second insulating film is in contact with the first insulating film, thereby forming the insulating film that is formed by the first insulating film and the second insulating film. In this case, even if the through hole has a high aspect ratio, the insulating film, which is formed by the first insulating film and the second insulating film, can be reliably formed so as to cover the entire inner wall of the through hole. Thus, reliability of insulation between the through electrode and the semiconductor substrate can further be increased. The method may further include the step of (g) increasing a diameter of the through hole from the second surface side between the steps (a2) and (b). In this case, the method may further include the steps of: (h) burying a nonmetal material in the through hole between the steps (f) and (a2); and (i) removing the nonmetal material from the through hole between the steps (a2) and (b). This can reduce or eliminate the possibility that an interconnect material and/or an interlayer film material may enter the through hole, when forming an interconnect layer on the first surface after forming the through hole from the first surface side. In this case, the nonmetal material is simultaneously ground or the like together with the semiconductor substrate, when thinning the semiconductor substrate from the second surface side so as to expose the bottom of the through hole. This can also avoid or reduce problems such as chipping in the through hole. In this case, the method may further include the step of: (j) forming a first conductive portion in a space surrounded by the first insulating film in the through hole between the steps (f) and (a2), and the step (c) may include the step of forming a second conductive portion in the space surrounded by the insulating film in the through hole, so that the second conductive portion is in contact with the first conductive portion, thereby forming the conductive portion that is formed by the first conductive portion and the second conductive portion. In this case, the through electrode having a smaller void can be formed even if the through hole has a high aspect ratio, whereby reliability of the through electrode can be increased. Moreover, when forming an interconnect layer on the first surface after forming the through hole from the first surface side, the possibility that an interconnect material and/or an interlayer film material may enter the through hole can be reduced or eliminated without burying any nonmetal material in the through hole.

As described above, according to the present disclosure, the insulating film formed on the back surface of the substrate, and the insulating film formed on the inner wall of the through hole form a continuous film. This can increase reliability of insulation between the through electrode and the semiconductor substrate on the back side of the substrate.

That is, the present disclosure relates to semiconductor devices having through electrodes, and manufacturing methods thereof. The present disclosure is very useful since reliability of insulation between each through electrode and a semiconductor substrate on the back side of the semiconductor device can be increased.

DETAILED DESCRIPTION

Embodiments of the present disclosure will be described in detail below with reference to the accompanying drawings.

First Embodiment

Figure 1A:
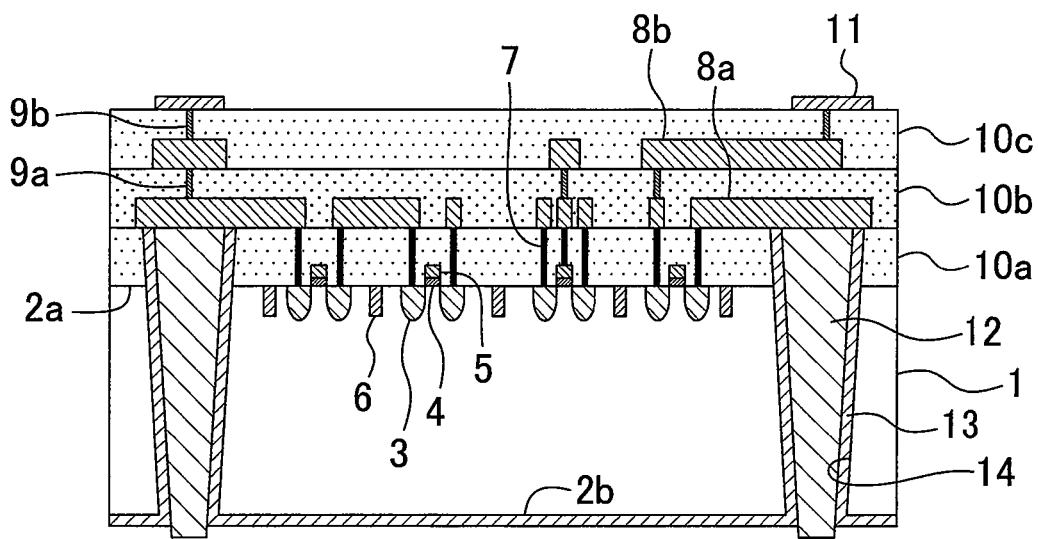
FIGS. 1A and 1B are cross-sectional views of a semiconductor device according to a first embodiment of the present disclosure.

FIG. 1A shows a cross-sectional structure of a semiconductor device 100 according to a first embodiment of the present disclosure. As shown in FIG. 1A, impurity regions 3 of active elements such as transistors and diodes are formed in a first surface 2a (a substrate surface portion) of a semiconductor substrate 1. Gate electrodes 5 are formed on the first surface 2a of the semiconductor substrate 1 with a gate insulating film 4 interposed therebetween. Note that the active elements are electrically isolated from each other by isolation regions 6 formed in the substrate surface portion. A first interlayer insulating film 10a is formed over the first surface 2a of the semiconductor substrate 1 so as to cover the gate electrodes 5. Contacts 7, which are connected to the impurity regions 3 and the gate electrodes 5, are formed in the first interlayer insulating film 10a. A second interlayer insulating film 10b is formed over the first interlayer insulating film 10a. First interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device 100. A third interlayer insulating film 10c is formed over the second interlayer insulating film 10b. Second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device 100. Electrode pads 11 connected to the second vias 9b are formed on the third interlayer insulating film 10c, and are configured to output signals externally.

As shown in FIG. 1A, through holes 14 are formed so as to extend through the semiconductor substrate 1 from the first surface 2a to a second surface 2b. An insulating film 13 is formed on the inner wall of each through hole 14. A conductive portion 12, which serves as a through electrode, is formed in a space surrounded by the insulating film 13 in each through hole 14.

Note that in the present embodiment, the through holes 14 extend also through the first interlayer insulating film 10a, and the conductive portions 12, which serve as the through electrodes, are connected to the first interconnects 8a. The diameter of the through holes 14 decreases in a direction from the first surface 2a (the first interlayer insulating film 10a) toward the second surface 2b, and the through holes 14 have the smallest diameter at the second surface 2b. That is, the through holes 14 have a reverse tapered cross section.

A feature of the present embodiment is that the insulating film 13, which is formed on the inner wall of each through hole 14, continuously extends on the second surface 2b.

According to this feature, the insulating film formed on the second surface 2b, namely on the back surface of the substrate, and the insulating film formed on the inner wall of each through hole 14 form the continuous film 13. This can reliably reduce or eliminate the possibility of short-circuits between the semiconductor substrate 1 and the through electrodes (the conductive portions 12) exposed from the back surface of the substrate, as compared to conventional structures in which these insulating films are separate films and there is a joint therebetween. This increases reliability of insulation between the through electrode and the substrate around each through electrode at the second surface 2b, whereby a semiconductor device having more reliable through electrodes can be implemented.

FIGS. 2A-2D, 3A-3D, and 4A-4C are cross-sectional views illustrating the steps of a manufacturing method of the semiconductor device according to the first embodiment.

Figure 2A:
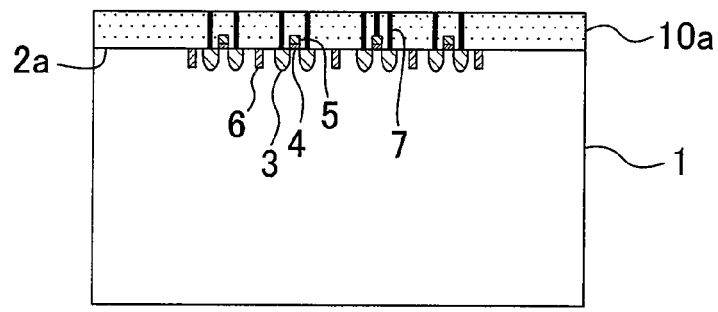
FIGS. 2A, 2B, 2C, and 2D are cross-sectional views illustrating the steps of a manufacturing method of the semiconductor device according to the first embodiment of the present disclosure.

First, as shown in FIG. 2A, impurity regions 3 of active elements such as transistors and diodes, and isolation regions 6 for electrically isolating the active elements from each other are formed in a first surface 2a (a substrate surface portion) of a semiconductor substrate 1. Then, gate electrodes 5 are formed on the first surface 2a of the semiconductor substrate 1 with a gate insulating film 4 interposed therebetween, and a first interlayer insulating film 10a is formed so as to cover the gate electrodes 5. Thereafter, contacts 7, which are connected to the impurity regions 3 and the gate electrodes 5, are formed in the first interlayer insulating film 10a.

Figure 2B:
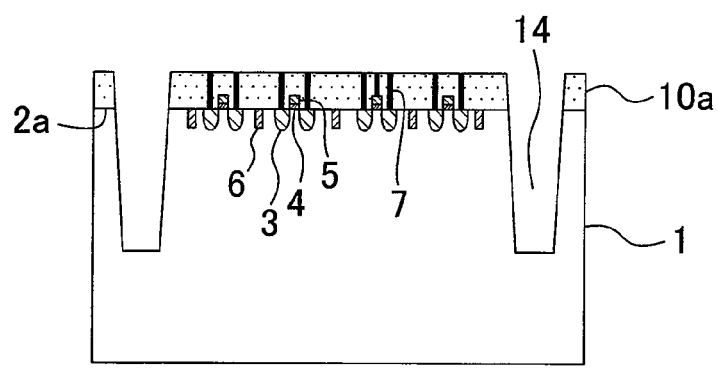

Then, as shown in FIG. 2B, through holes 14 are formed so as to extend through the first interlayer insulating film 10a to an intermediate depth in the semiconductor substrate 1. The through holes 14 may be formed so as to extend to a second surface 2b, which is an opposite surface of the semiconductor substrate 1. However, in the present embodiment, formation of the through holes 14 is terminated at the intermediate depth in the semiconductor substrate 1 according to a final required depth. No through hole 14 is formed in the regions where the active elements are formed. The through holes 14 are formed by a known technique. For example, the through holes 14 may be formed by a lithography technique and an etching technique. More specifically, a patterned resist (not shown) may be formed by a lithography technique, and the through holes 14 may be formed by an etching technique such as dry etching or wet etching by using the patterned resist as a mask. Alternatively, the through holes 14 may be formed by using a laser (e.g., a $CO_2$ laser or an yttrium aluminum garnet (YAG) laser). Note that in the present embodiment, the diameter of the through holes 14 decreases in the direction from the first surface 2a (the first interlayer insulting film 10a) toward the second surface 2b. The through holes 14 have the largest diameter at the upper surface of the first interlayer insulating film 10a, and have the smallest diameter at the second surface 2b. That is, the through holes 14 have a reverse tapered cross section. More specifically, the smallest diameter of the through holes 14 is, e.g., about 0.1 to 20 μm (desirably about 0.5 to 5 μm), and the largest diameter of the through holes 14 is, e.g., about 1 to 50 μm. The depth of the through holes 14 is about 5 to 50 μm.

Figure 2C:
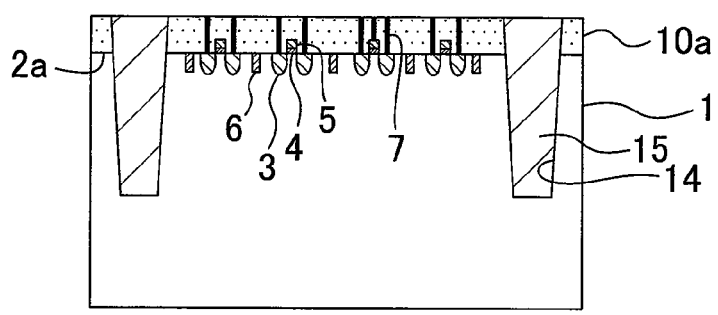

Then, as shown in FIG. 2C, a nonmetal material 15 is buried in the through holes 14. The nonmetal material 15 is desirably a material that can be easily removed later. For example, an organic material such as a resist material is desirable as the nonmetal material 15. It should be noted that a conductive material such as a conductive polymer may be used as the nonmetal material 15 as long as it does not diffuse into the semiconductor substrate 1 and can be easily removed later. The nonmetal material 15 can be buried in the through holes 14 by, e.g., a spin coating method or a spray method.

Burying the nonmetal material 15 in the through holes 14 in this manner can reduce or eliminate the possibility that an interlayer film material and/or an interconnect material may enter the through holes 14 and cause defects, when forming internal interconnects of the semiconductor device above the through holes 14 in a later step. Burying the nonmetal material 15 in the through holes 14 can also avoid or reduce problems such as chipping in the through holes 14, since the nonmetal material 15 is simultaneously ground or the like together with the substrate in a substrate thinning step that is performed later.

Figure 2D:
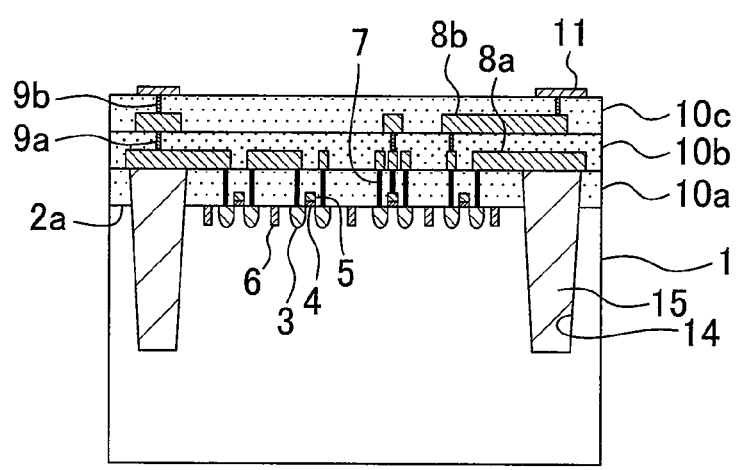

Then, as shown in FIG. 2D, a second interlayer insulating film 10b is formed over the first interlayer insulating film 10a. Thereafter, first interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device. The first interconnects 8a are formed so as to cover the through holes 14 having the nonmetal material 15 buried therein. Then, a third interlayer insulating film 10c is formed over the second interlayer insulating film 10b. Thereafter, second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device. Then, electrode pads 11 connected to the second vias 9b are formed on the third interlayer insulating film 10c, and are configured to output signals externally.

Note that although FIG. 2D shows an example of forming a two-layer interconnect structure, the number of interconnect layers can be changed as needed, and the present disclosure is not limited to the two-layer interconnect structure.

Figure 3A:
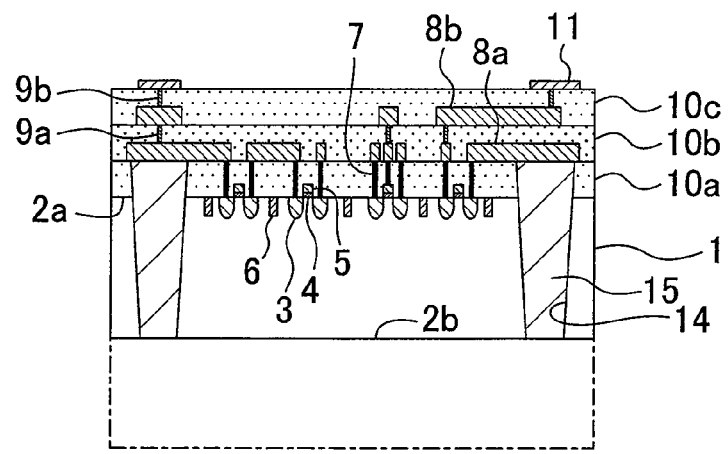
FIGS. 3A, 3B, 3C, and 3D are cross-sectional views illustrating the steps of the manufacturing method of the semiconductor device according to the first embodiment of the present disclosure.

Then, as shown in FIG. 3A, the semiconductor substrate 1 is thinned from the surface opposite to the first surface 2a. For example, the semiconductor substrate 1 can be thinned by a method such as, e.g., mechanical grinding/polishing or chemical grinding/polishing. In the present embodiment, the semiconductor substrate 1 is thinned to a final thickness of about 5 to 150 μm, thereby exposing the bottoms of the through holes 14.

Note that in the substrate thinning step, the smaller the final substrate thickness is, the more fragile the substrate becomes, and the more the substrate tends to crack or fracture or the like. In order to prevent this problem, the substrate may be reinforced by bonding the upper surface of the semiconductor device to a support substrate in the substrate thinning step.

Figure 3B:
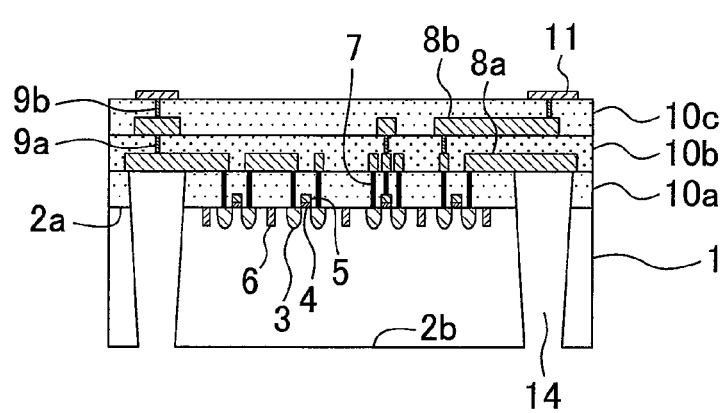

Then, as shown in FIG. 3B, the nonmetal material 15 buried in the through holes 14 is removed from the second surface 2b side to expose the inside of each through hole 14. The second surface 2b is a surface of the semiconductor substrate 1, which is formed by the substrate thinning step. The nonmetal material 15 is removed by an optimal method that is determined according to the type of the nonmetal material 15. For example, the nonmetal material 15 can be removed by a method using a chemical, or by thermal sublimation, plasma ashing, or the like.

Figure 3C:
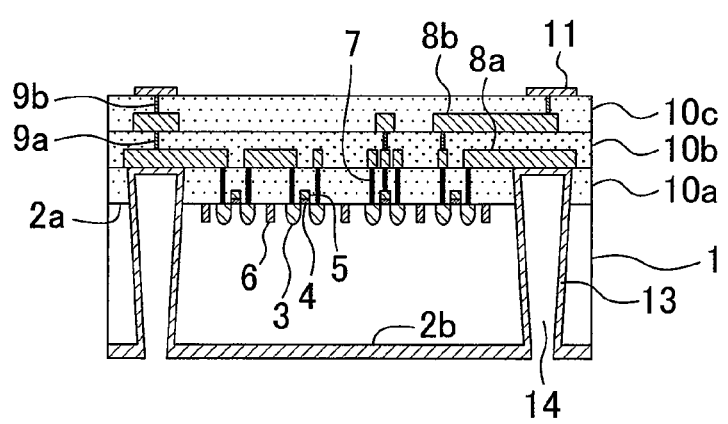

Then, as shown in FIG. 3C, an insulating film 13 is formed from the second surface 2b side. The insulating film 13 is formed on the second surface 2b, on the inner walls of the through holes 14, and on the lower surfaces of the first interconnects 8a that cover the through holes 14. The insulating film 13 may be made of, e.g., $SiO_2$, SiN, or the like. In another possible method of forming the insulating film 13, a resist is formed in advance by a known technique such as photolithography, on the second surface 2b so as to cover those regions where the insulating film 13 should not be formed. Then, the insulating film 13 is formed, and the insulating film 13 in these regions is removed together with the underlying resist.

Figure 3D:
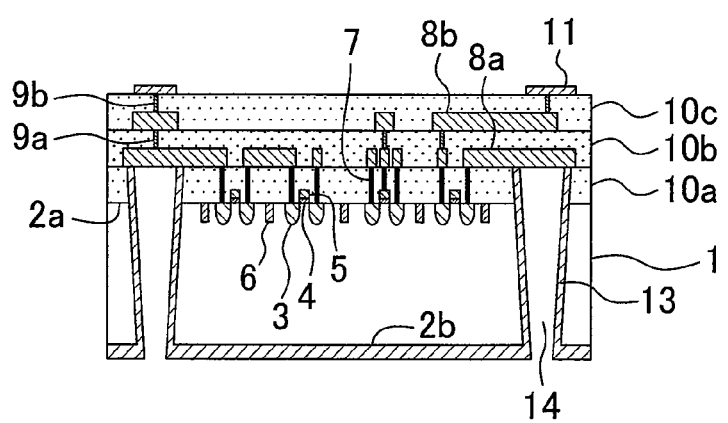

Then, as shown in FIG. 3D, the insulating film 13 is removed from the lower surfaces of the first interconnects 8a that cover the through holes 14, by a method such as dry etching, wet etching, or the like.

Figure 4A:
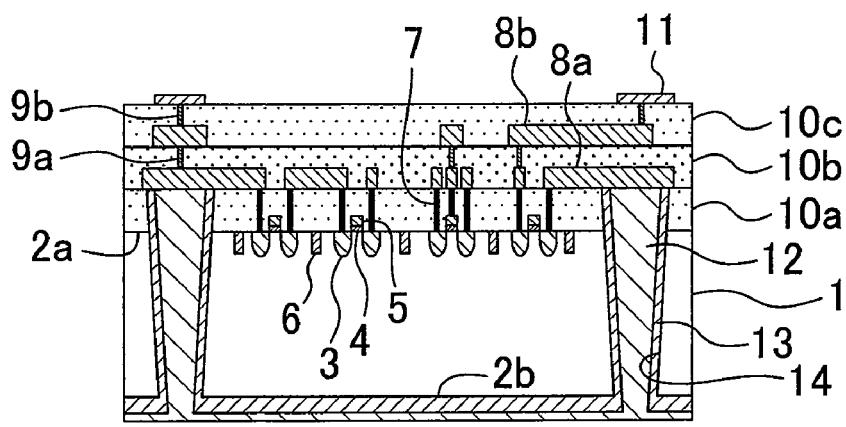
FIGS. 4A, 4B, and 4C are cross-sectional views illustrating the steps of the manufacturing method of the semiconductor device according to the first embodiment of the present disclosure.

Thereafter, as shown in FIG. 4A, a conductive portion 12 is formed in a space surrounded by the insulating film 13 in each through hole 14. More specifically, a conductive film, which serves as the conductive portions 12, is formed from the second surface 2b side so as to fill the through holes 14. The conductive portions 12 are made of, e.g., Cu, W, Al, or polysilicon. Note that a protective film for preventing diffusion of the material of the conductive portion 12 is preferably formed between the conductive portion 12 and the insulating film 13 in each through hole 14. The protective film is preferably made of a material having a barrier property, such as, e.g., Ta, TaN, TiN, or the like.

Figure 4B:
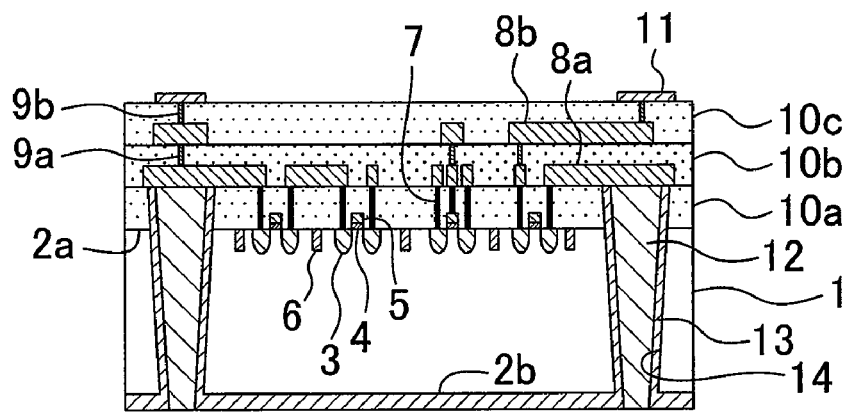

Then, as shown in FIG. 4B, an unnecessary part of the conductive film is removed by a method such as chemical polishing/grinding, mechanical polishing/grinding, or the like. More specifically, the conductive film, which is formed in the step of burying the conductive portions 12, namely through electrodes, is partially removed so as to leave only those portions which serve as the through electrodes.

Figure 4C:
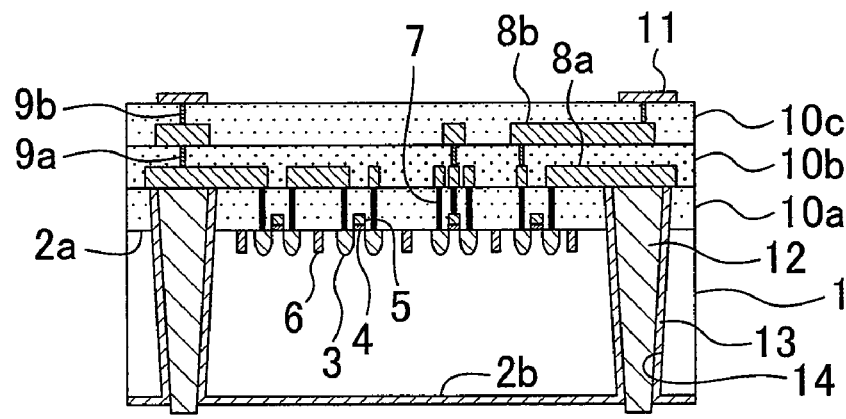

Then, as shown in FIG. 4C, the insulating film 13 is selectively etched and thinned at least around each through electrode so that the through electrodes, formed by the conductive portions 12, protrude from the second surface 2b side. This etching method may be either dry etching or wet etching.

According to the semiconductor device of the present embodiment formed as described above, a stacked semiconductor device can be implemented by bonding the protruding portions of the conductive portions 12 at the second surface 2b and electrode pads of another semiconductor device together via solder bumps or by directly bonding the metals, or the like. Thus, the semiconductor devices can be connected together with the smallest gap therebetween, and the area of the stacked semiconductor device can be reduced as compared to conventional stacked semiconductor devices using wire bonding, by an amount corresponding to the region for extending the wires. As a result, a smaller stacked semiconductor device can be implemented.

According to the present embodiment, since the insulating film 13 is formed in advance on the second surface 2b of the semiconductor device 100, no additional insulating film for insulating the semiconductor device 100 from another semiconductor device to be stacked thereon is required to form a stacked semiconductor device as described above. Moreover, since the insulating film 13 is formed in advance on the second surface 2b of the semiconductor device 100, a material having low moisture resistance, such as, e.g., polyimide, can be used as a filling material for filling the gap between the semiconductor devices, thereby increasing the range of selection of the material.

Figure 5A:
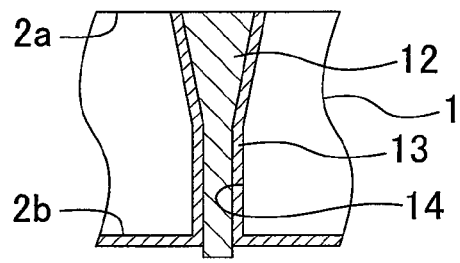
FIGS. 5A and 5B are diagrams showing variations of the cross-sectional shape of a through hole in the semiconductor device according to the first embodiment of the present disclosure.
Figure 5B:
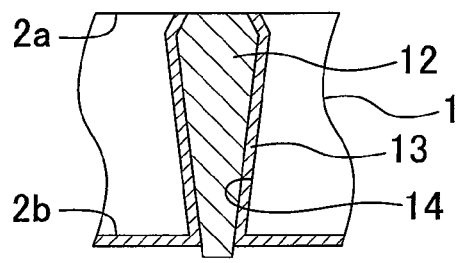

Note that in the present embodiment, the diameter of the through holes 14 decreases in the direction from the first surface 2a (the first interlayer insulating film 10a) toward the second surface 2b. The through holes 14 have the largest diameter at the upper surface of the first interlayer insulating film 10a, and have the smallest diameter at the second surface 2b. That is, the through holes 14 have a reverse tapered cross section. However, in the present embodiment, the cross-sectional shape of the through holes 14 is not specifically limited, and the through holes 14 may have other cross-sectional shapes for ease of forming the through holes 14, and the like. FIGS. 5A-5B show variations of the cross-sectional shape of the through hole 14. As shown in FIG. 5A, the through hole 14 may have a reverse tapered cross section from the first surface 2a side to an intermediate depth in the semiconductor substrate 1, and have a vertical inner wall thereunder. Alternatively, as shown in FIG. 5B, the through hole 14 may have a reverse tapered cross section having an undercut on the first surface 2a side. That is, as shown in FIGS. 5A-5B, the through hole 14 may have a larger diameter only in a portion near the first surface 2a than in the remaining portion. As in the present embodiment, in the case where the through hole 14 extend also in the interlayer film located on the first surface 2a, the through hole 14 may have a larger diameter only in a portion near the upper surface of the interlayer film than in the remaining portion. This can implement a space-efficient arrangement of the through electrodes without increasing the area that is occupied by the through electrodes in the semiconductor substrate 1, and can reduce contact resistance between the through electrode and the interconnect or the electrode pad. In the structure of FIG. 5A, the reverse tapered portion of the through hole 14 can be formed from the first surface 2a side of the semiconductor substrate 1, and the remaining portion of the through hole 14 can be formed from the second surface 2b side of the semiconductor substrate 1. This facilitates the process of forming the through holes 14. Note that in FIGS. 5A-5B, the same components as those of the semiconductor device 100 of FIG. 1A are denoted by the same reference characters, and repetitive description thereof is omitted. Components such as the first interlayer insulating film 10a are not shown in FIGS. 5A-5B.

The present embodiment is described with respect to an example in which the nonmetal material 15 is buried in the through holes 14 in the step of FIG. 2C. However, if this step is not required, the steps of burying the nonmetal material 15 in the through holes 14 and removing the nonmetal material 15 are omitted.

Figure 1B:
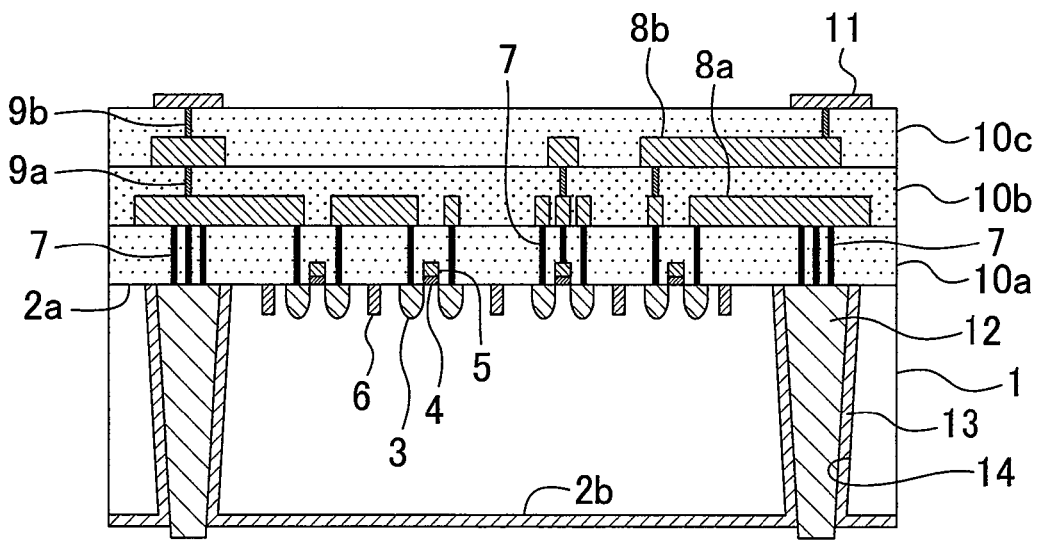

The present embodiment is described with respect to an example in which the conductive portions 12 that serve as the through electrodes are connected to the first interconnects 8a. However, the present disclosure is not limited to this. The conductive portions 12 that serve as the through electrodes may be connected to interconnects of other layers such as the second interconnects 8b, and/or to the electrode pads 11. Alternatively, the conductive portions 12 may not be connected to any internal interconnect of the semiconductor device 100. Note that the manufacturing method of the semiconductor device described in the present embodiment is modified as appropriate according to the individual case. For example, the through holes 14 may be formed after forming the second interlayer insulating film 10b or the third interlayer insulating film 10c. Alternatively, as shown in FIG. 1B, the through holes 14 may be formed so as to extend only through the semiconductor substrate 1, and the conductive portions 12, which serve as the through electrode, may be electrically connected to the first interconnects 8a via the contacts 7 formed in the first interlayer insulating film 10a. In this case, the through holes 14 can be formed by a one-step etching process (a process of etching only the semiconductor substrate 1 (e.g., a Si substrate)). This can reduce cost and can increase throughput as compared to the case of forming the through holes 14 by a two-step etching process (a process of etching the semiconductor substrate 1 (e.g., a Si substrate) and the first interlayer insulating film 10a (e.g., a silicon oxide film). The contacts 7 for connecting the conductive portions 12 as the through electrodes with the first wirings 8a can be formed simultaneously with the contacts 7 for connecting the impurity regions 3 and the gate electrodes 5 with the first interconnects 8a. Note that the configuration as shown in FIG. 1B, that is, the configuration in which the through holes 14 are formed only in the semiconductor substrate 1, can be applied as appropriate to other embodiments (including modifications) described below.

In the present embodiment, the selective etching process is performed in the step of FIG. 4C to thin the insulating film 13 at least around each conductive portion 12. However, in the case where the through electrodes formed by the conductive portions 12 need not protrude from the second surface 2b side, the step of FIG. 4C may be omitted, and the lower surface of the insulating film 13 may be made flush with the bottom surfaces of the conductive portions 12.

Second Embodiment

Figure 6:
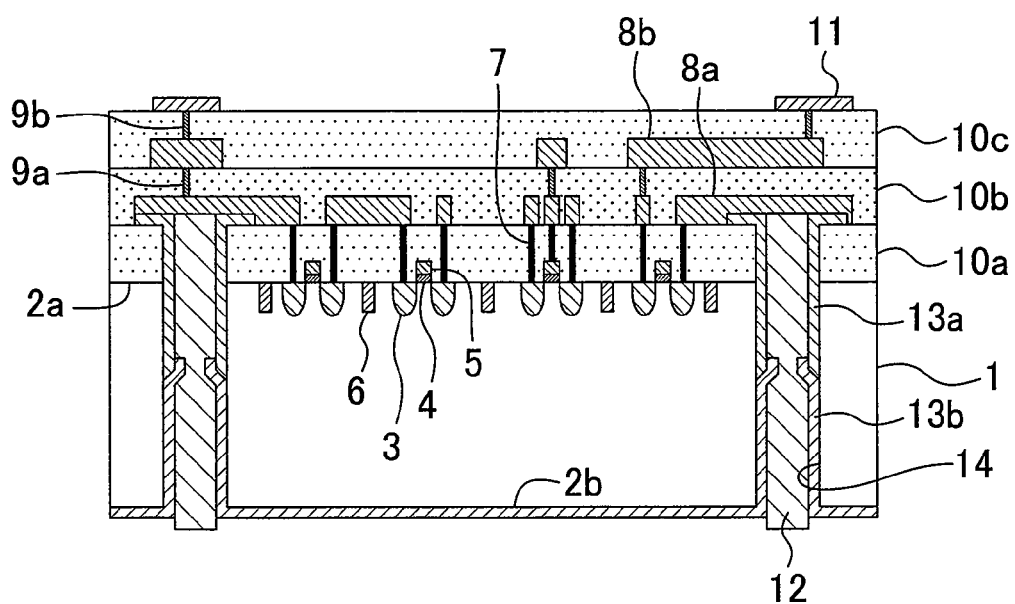
FIG. 6 is a cross-sectional view of a semiconductor device according to a second embodiment of the present disclosure.

FIG. 6 shows a cross-sectional structure of a semiconductor device 101 according to a second embodiment of the present disclosure. As shown in FIG. 6, impurity regions 3 of active elements such as transistors and diodes are formed in a first surface 2a (a substrate surface portion) of a semiconductor substrate 1. Gate electrodes 5 are formed on the first surface 2a of the semiconductor substrate 1 with a gate insulating film 4 interposed therebetween. Note that the active elements are electrically isolated from each other by isolation regions 6 formed in the substrate surface portion. A first interlayer insulating film 10a is formed over the first surface 2a of the semiconductor substrate 1 so as to cover the gate electrodes 5. Contacts 7, which are connected to the impurity regions 3 and the gate electrodes 5, are formed in the first interlayer insulating film 10a. A second interlayer insulating film 10b is formed over the first interlayer insulating film 10a. First interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device 101. A third interlayer insulating film 10c is formed over the second interlayer insulating film 10b. Second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device 101. Electrode pads 11 connected to the second vias 9b are formed on the third interlayer insulating film 10c, and are configured to output signals externally.

As shown in FIG. 6, through holes 14 are formed so as to extend through the semiconductor substrate 1 from the first surface 2a to a second surface 2b. The through holes 14 extend also through the first interlayer insulating film 10a. A feature of the present embodiment is that a first insulating film 13a continuously extends on the inner wall of each through hole 14 and on the upper surface of the first interlayer insulating film 10a, and that a second insulating film 13b continuously extends on the inner wall of each through hole 14 and on the second surface 2b of the semiconductor substrate 1. Note that the first insulating film 13a and the second insulating film 13b are formed so as to partially overlap each other at their ends on the inner wall of each through hole 14. A conductive portion 12, which serves as a through electrode, is formed in a space surrounded by the insulating films 13a, 13b in each through hole 14. The conductive portions 12 as the through electrodes are connected to the first interconnects 8a.

According to the present embodiment, the insulating film formed on the second surface 2b, namely on the back surface of the substrate, and the insulating film formed on the inner wall of each through hole 14 form the continuous film 13b. This can reliably reduce or eliminate the possibility of short-circuits between the semiconductor substrate 1 and the through electrodes (the conductive portions 12) exposed from the back surface of the substrate, as compared to the conventional structures in which these insulating films are separate films and there is a joint therebetween. This increases reliability of insulation between the through electrode and the substrate around each through electrode at the second surface 2b, whereby a semiconductor device having more reliable through electrodes can be implemented.

Incidentally, in the case of forming an insulating film on the inner wall of a through hole only from one end side of the through hole by a known technique such as a chemical vapor deposition (CVD) method, it is difficult to form a uniform insulating film on the entire inner wall of the through hole if the through hole has a high aspect ratio (e.g., if the through hole has a diameter of 2 μm and a depth of 20 μm). In particular, the greater the depth of the through hole is, the thinner the formed insulating film is, which can reduce insulation reliability.

As a solution to this problem, according to the present embodiment, the first insulating film 13a is formed from the first surface 2a side (from the first interlayer insulating film 10a side), and the second insulating film 13b is formed from the second surface 2b side (from the back side of the substrate). In this case, the insulating films, which cover the entire inner wall of each through hole 14, can be reliably formed even if the through holes 14 have a high aspect ratio. Thus, reliability of insulation between each through electrode and the semiconductor substrate 1 can further be increased.

FIGS. 7A-7D, 8A-8D, and 9A-9C are cross-sectional views illustrating the steps of a manufacturing method of the semiconductor device according to the second embodiment.

Figure 7A:
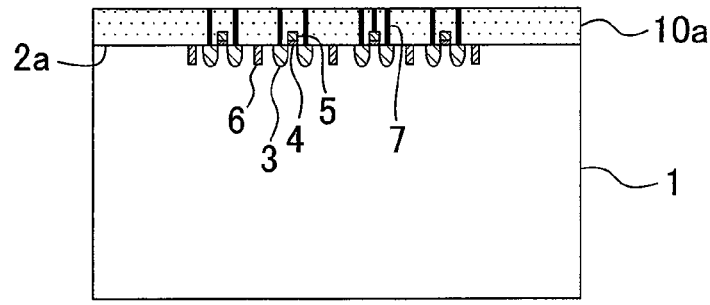
FIGS. 7A, 7B, 7C, and 7D are cross-sectional views illustrating the steps of a manufacturing method of the semiconductor device according to the second embodiment of the present disclosure.

First, as shown in FIG. 7A, impurity regions 3 of active elements such as transistors and diodes, and isolation regions 6 for electrically isolating the active elements from each other are formed in a first surface 2a (a substrate surface portion) of a semiconductor substrate 1. Then, gate electrodes 5 are formed on the first surface 2a of the semiconductor substrate 1 with a gate insulating film 4 interposed therebetween, and a first interlayer insulating film 10a is formed so as to cover the gate electrodes 5. Thereafter, contacts 7, which are connected to the impurity regions 3 and the gate electrodes 5, are formed in the first interlayer insulating film 10a.

Figure 7B:
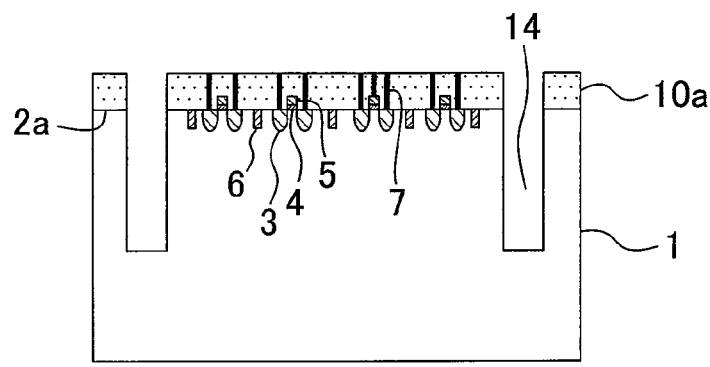

Then, as shown in FIG. 7B, through holes 14 are formed so as to extend through the first interlayer insulating film 10a to an intermediate depth in the semiconductor substrate 1. The through holes 14 may be formed so as to extend to a second surface 2b, which is an opposite surface of the semiconductor substrate 1. However, in the present embodiment, formation of the through holes 14 is terminated at the intermediate depth in the semiconductor substrate 1 according to a final required depth. No through hole 14 is formed in the regions where the active elements are formed. The through holes 14 are formed by a known technique. For example, the through holes 14 may be formed by a lithography technique and an etching technique. More specifically, a patterned resist (not shown) may be formed by a lithography technique, and the through holes 14 may be formed by an etching technique such as dry etching or wet etching by using the resist as a mask. Alternatively, the through holes 14 may be formed by using a laser (e.g., a $CO_2$ laser or a YAG laser). Note that the diameter of the through holes 14 is, e.g., about 0.1 to 20 μm (desirably about 0.5 to 5 μm), and the depth of the through holes 14 is, e.g., about 5 to 50 μm.

Figure 7C:
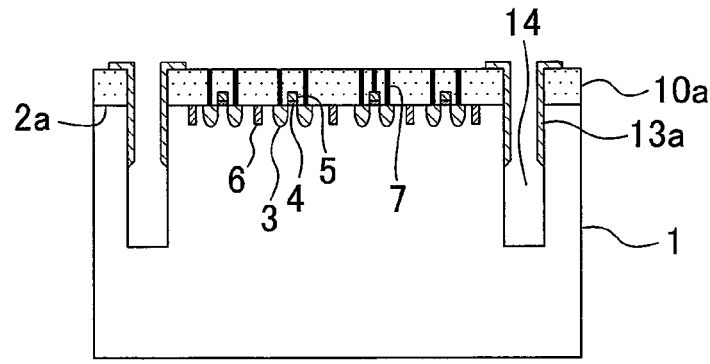

Then, as shown in FIG. 7C, a first insulating film 13a is formed on the first interlayer insulating film 10a and on the inner wall of each through hole 14 from the first surface 2a side (to be exact, from the first interlayer insulating film 10a side). The first insulating film 13a is formed so as to continuously extend on the first interlayer insulating film 10a, and on the inner wall of each through hole 14 to an intermediate depth thereof. Note that although FIG. 7C shows an example in which the first insulating film 13a is formed only around each through hole 14 on the first interlayer insulating film 10a, the first insulating film 13a may be formed on the entire surface of the first interlayer insulating film 10a as needed. The first insulating film 13a can be made of, e.g., $SiO_2$, SiN, or the like.

Figure 7D:
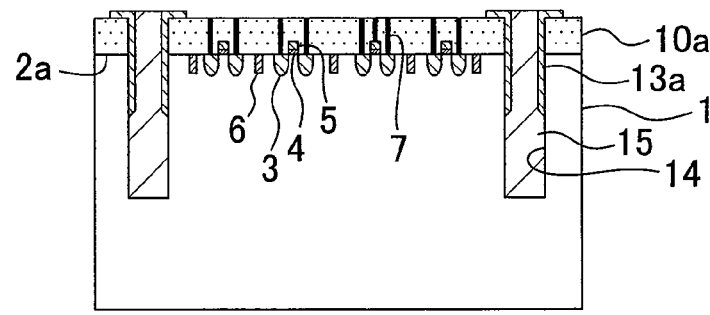

Then, as shown in FIG. 7D, a nonmetal material 15 is buried in the through holes 14. The nonmetal material 15 is desirably a material that can be easily removed later. For example, an organic material such as a resist material or benzocyclobutene (BCB) is desirable as the nonmetal material 15. It should be noted that a conductive material such as a conductive polymer may be used as the nonmetal material 15 as long as it does not diffuse into the semiconductor substrate 1 and can be easily removed later. The nonmetal material 15 can be buried in the through holes 14 by, e.g., a spin coating method or a spray method.

Burying the nonmetal material 15 in the through holes 14 in this manner can reduce or eliminate the possibility that an interlayer film material and/or an interconnect material may enter the through holes 14 and cause defects, when forming internal interconnects of the semiconductor device above the through holes 14 in a later step. Burying the nonmetal material 15 in the through holes 14 can also avoid or reduce problems such as chipping in the through holes 14, since the nonmetal material 15 is simultaneously ground or the like together with the substrate in a substrate thinning step that is performed later.

Figure 8A:
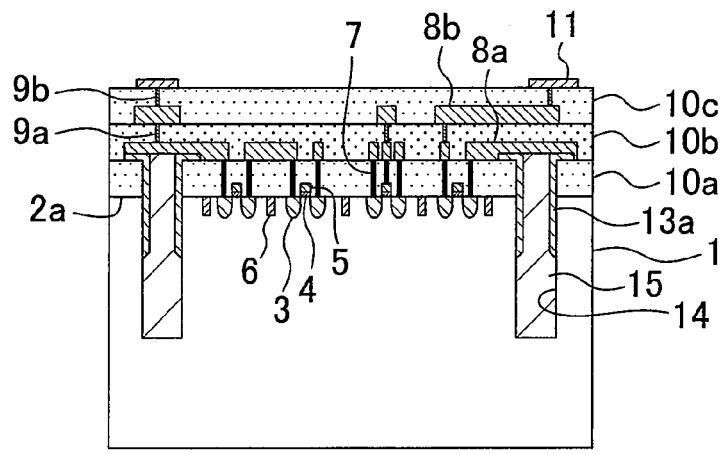
FIGS. 8A, 8B, 8C, and 8D are cross-sectional views illustrating the steps of the manufacturing method of the semiconductor device according to the second embodiment of the present disclosure.

Then, as shown in FIG. 8A, a second interlayer insulating film 10b is formed over the first interlayer insulating film 10a. Thereafter, first interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device. The first interconnects 8a are formed so as to cover the through holes 14 having the nonmetal material 15 buried therein. Then, a third interlayer insulating film 10c is formed over the second interlayer insulating film 10b. Thereafter, second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device. Then, electrode pads 11 connected to the second vias 9b are formed on the third interlayer insulating film 10c, and are configured to output signals externally.

Note that although FIG. 8A shows an example of forming a two-layer interconnect structure, the number of interconnect layers can be changed as needed, and the present disclosure is not limited to the two-layer interconnect structure.

Figure 8B:
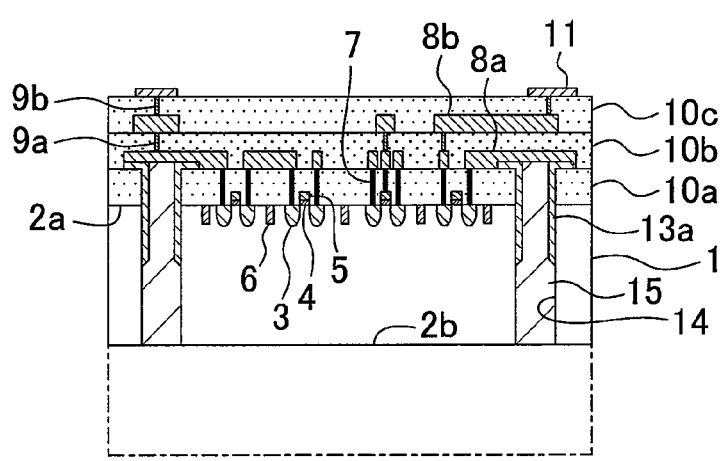

Then, as shown in FIG. 8B, the semiconductor substrate 1 is thinned from the surface opposite to the first surface 2a. For example, the semiconductor substrate 1 can be thinned by a method such as, e.g., mechanical grinding/polishing or chemical grinding/polishing. In the present embodiment, the semiconductor substrate 1 is thinned to a final thickness of about 5 to 150 μm, thereby exposing the bottoms of the through holes 14.

Note that in the substrate thinning step, the smaller the final substrate thickness is, the more fragile the substrate becomes, and the more the substrate tends to crack or fracture or the like. In order to prevent this problem, the substrate may be reinforced by bonding the upper surface of the semiconductor device to a support substrate in the substrate thinning step.

Figure 8C:
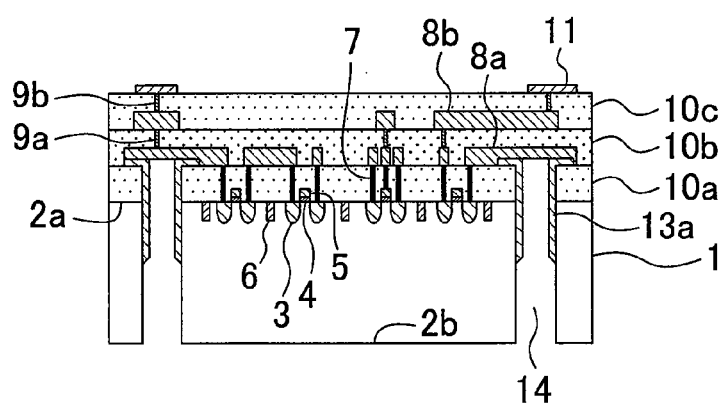

Then, as shown in FIG. 8C, the nonmetal material 15 buried in the through holes 14 is removed from the second surface 2b side to expose the inside of each through hole 14. The second surface 2b is a surface of the semiconductor substrate 1, which is formed by the substrate thinning step. The nonmetal material 15 is removed by an optimal method that is determined according to the type of the nonmetal material 15. For example, the nonmetal material 15 can be removed by a method using a chemical, or by thermal sublimation, plasma ashing, or the like.

Figure 8D:
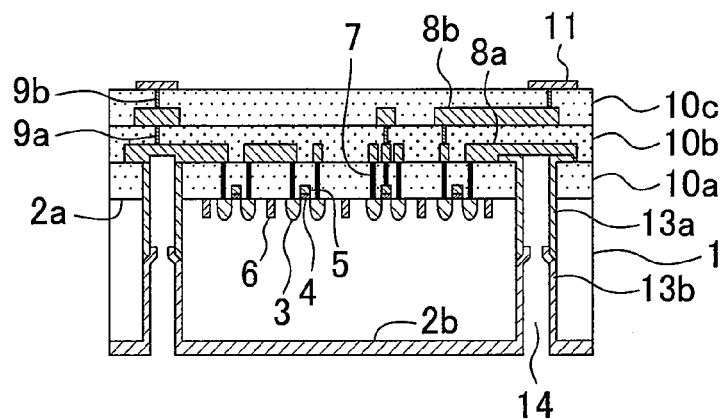

Then, as shown in FIG. 8D, a second insulating film 13b is formed from the second surface 2b side. The second insulating film 13b is formed on the second surface 2b and on the inner walls of the through holes 14. More specifically, the second insulating film 13b is formed so as to continuously extend on the second surface 2b and on the inner wall of each through hole 14, and to partially overlap the first insulating film 13a formed in advance on the inner wall of each through hole 14. The material of the second insulating film 13b may be either the same as, or different from that of the first insulating film 13a. The second insulating film 13b may be made of, e.g., $SiO_2$, SiN, or the like. In another possible method of forming the second insulating film 13b, a resist is formed in advance by a known technique such as photolithography, on the second surface 2b so as to cover those regions where the second insulating film 13b should not be formed. Then, the second insulating film 13b is formed, and the second insulating film 13b in these regions is removed together with the underlying resist.

Figure 9A:
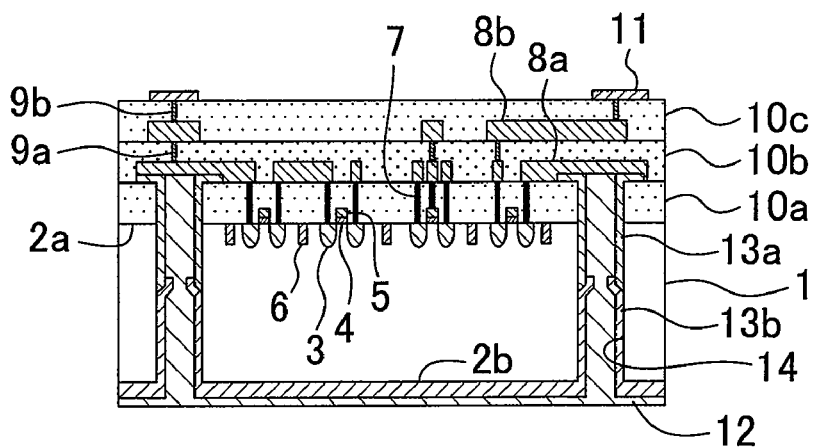
FIGS. 9A, 9B, and 9C are cross-sectional views illustrating the steps of the manufacturing method of the semiconductor device according to the second embodiment of the present disclosure.

Thereafter, as shown in FIG. 9A, a conductive portion 12 is formed in a space surrounded by the insulating films 13a, 13b in each through hole 14. More specifically, a conductive film, which serves as the conductive portions 12, is formed from the second surface 2b side so as to fill the through holes 14. The conductive portions 12 are made of, e.g., Cu, W, Al, or polysilicon. Note that a protective film for preventing diffusion of the material of the conductive portion 12 is preferably formed between the conductive portion 12 and the insulating films 13a, 13b in each through hole 14. The protective film is preferably made of a material having a barrier property, such as, e.g., Ta, TaN, TiN, or the like.

Figure 9B:
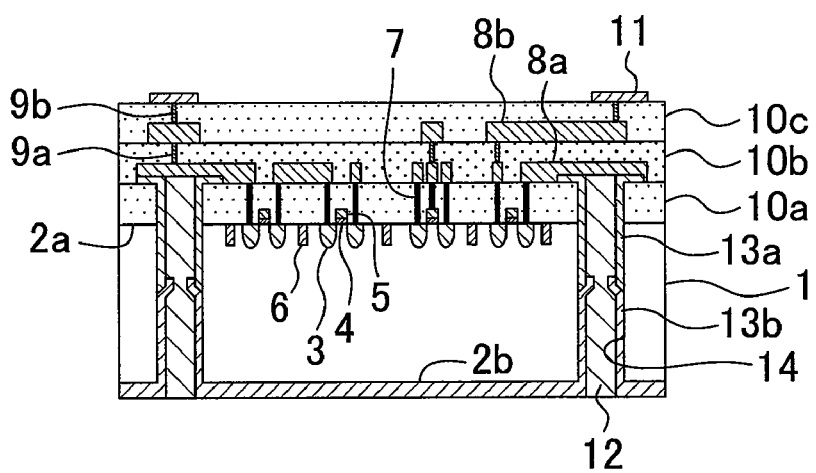

Then, as shown in FIG. 9B, an unnecessary part of the conductive film is removed by a method such as chemical polishing/grinding, mechanical polishing/grinding, or the like. More specifically, the conductive film, which is formed in the step of burying the conductive portions 12, namely through electrodes, is partially removed so as to leave only those portions which serve as the through electrodes.

Figure 9C:
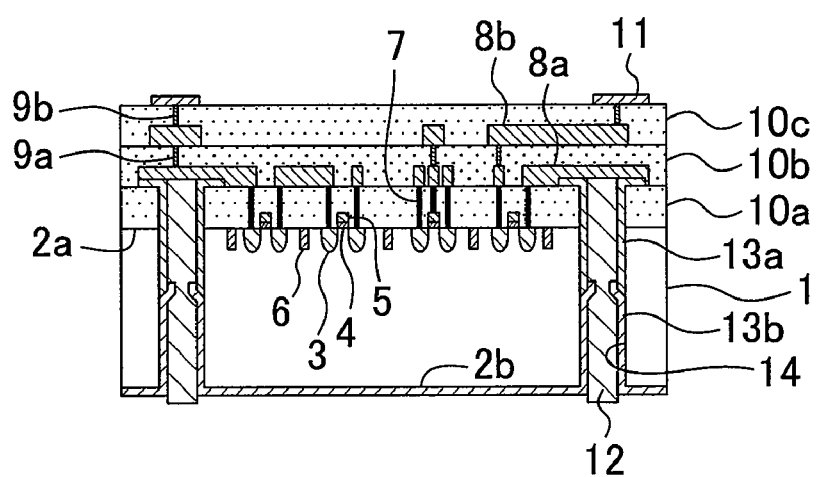

Then, as shown in FIG. 9C, the second insulating film 13b is selectively etched and thinned at least around each through electrode so that the through electrodes, formed by the conductive portions 12, protrude from the second surface 2b side. This etching method may be either dry etching or wet etching.

According to the semiconductor device of the present embodiment formed as described above, a stacked semiconductor device can be implemented by bonding the protruding portions of the conductive portions 12 at the second surface 2b and electrode pads of another semiconductor device together via solder bumps or by directly bonding the metals, or the like. Thus, the semiconductor devices can be connected together with the smallest gap therebetween, and the area of the stacked semiconductor device can be reduced as compared to conventional stacked semiconductor devices using wire bonding, by an amount corresponding to the region for extending the wires. As a result, a smaller stacked semiconductor device can be implemented.

According to the present embodiment, since the second insulating film 13b is formed in advance on the second surface 2b of the semiconductor device 101, no additional insulating film for insulating the semiconductor device 101 from another semiconductor device to be stacked thereon is required to form a stacked semiconductor device as described above. Moreover, since the second insulating film 13b is formed in advance on the second surface 2b of the semiconductor device 101, a material having low moisture resistance, such as, e.g., polyimide, can be used as a filling material for filling the gap between the semiconductor devices, thereby increasing the range of selection of the material.

Figure 10A:
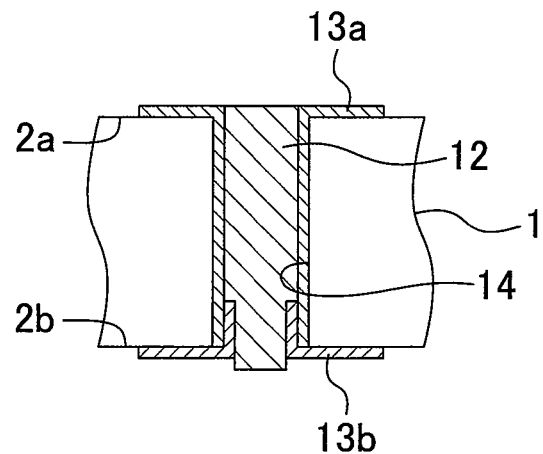
FIGS. 10A, 10B, and 10C are diagrams showing variations of an insulating film structure formed on the inner wall of a through hole in the semiconductor device according to the second embodiment of the present disclosure.
Figure 10B:
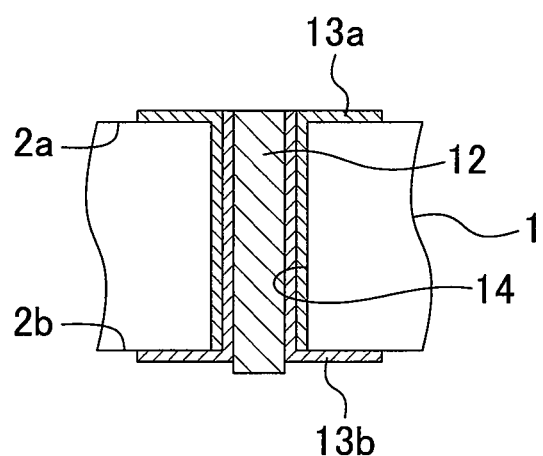
Figure 10C:
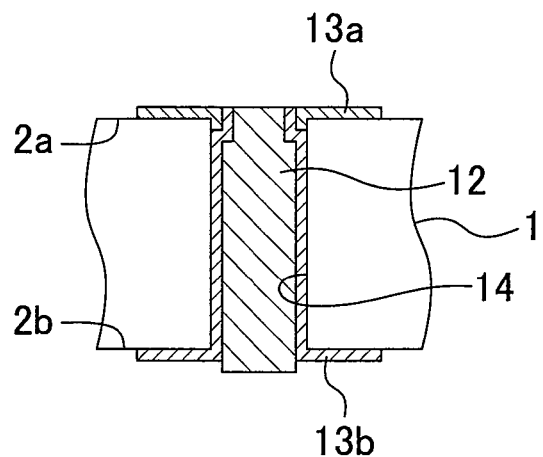

Note that the present embodiment shows the structure in which the first insulating film 13a and the second insulating film 13b are formed on the inner wall of each through hole 14 so as to partially overlap each other at an intermediate depth of the through hole 14. However, the present invention is not limited to this. FIGS. 10A-10C show variations of the first and second insulating film 13a, 13b formed on the inner wall of each through hole 14. In FIGS. 10A-10C, the same components as those of the semiconductor device 101 of FIG. 6 are denoted by the same reference characters, and repetitive description thereof is omitted. Components such as the first interlayer insulating film 10a are not shown in FIGS. 10A-10C.

As shown in FIG. 10A, the first insulating film 13a may be formed so as to extend to the bottom of the through hole 14, namely to the second surface 2b. According to the structure of FIG. 10A, the second insulating film 13b need only be formed in a relatively shallow region in the through hole 14 as viewed from the second surface 2b side. This facilitates formation of the second insulating film 13b, e.g., in the case where the through hole 14 has the smallest diameter on the second surface 2b side (namely, in the case where the through hole 14 has a reverse tapered cross section).

As shown in FIG. 10B, the first insulating film 13a may be formed so as to extend to the bottom of the through hole 14, namely to the second surface 2b. In addition, the second insulating film 13b may be formed so as to extend to the top of the through hole 14, namely to the first surface 2a (or to the upper surface of the interlayer film located on the first surface 2a, if the through hole 14 extends also through this interlayer film). According to the structure of FIG. 10B, both the first insulating film 13a and the second insulating film 13b overlap each other on the entire inner wall of the through hole 14. This increases insulation reliability on the inner wall of the through hole 14.

As shown in FIG. 10C, the first insulating film 13a may be formed only near the top of the through hole 14, namely only near the first surface 2a (or only near the upper surface of the interlayer film located on the first surface 2a, if the through hole 14 extends also through this interlayer film). In addition, the second insulating film 13b may be formed so as to extend to the top of the through hole 14, namely to the first surface 2a (or to the upper surface of the interlayer film located on the first surface 2a, if the through hole 14 extends also through this interlayer film). According to the structure of FIG. 10C, the first insulating film 13a need only be formed in a relatively shallow region in the through hole 14 as viewed from the first surface 2a side (or as viewed from the upper surface side of the interlayer film located on the first surface 2a, if the through hole 14 extends also through this interlayer film). This facilitates formation of the first insulating film 13a, e.g., in the case where the through hole 14 has the smallest diameter on the first surface 2a side (or on the upper surface side of the interlayer film located on the first surface 2a, if the through hole 14 extends also through this interlayer film), namely in the case where the through hole 14 has a forward tapered cross section.

That is, any similar structure other than the structures shown in FIGS. 6 and 10A-10C can be used in the present disclosure, as long as the first insulating film 13a continuously extends on the first surface 2a (or on the upper surface of the interlayer film located on the first surface 2a, if the through hole 14 extends also through this interlayer film) and on the inner wall of the through hole 14, and the second insulating film 13b continuously extends on the second surface 2b and on the inner wall of the through hole 14.

Figure 11:
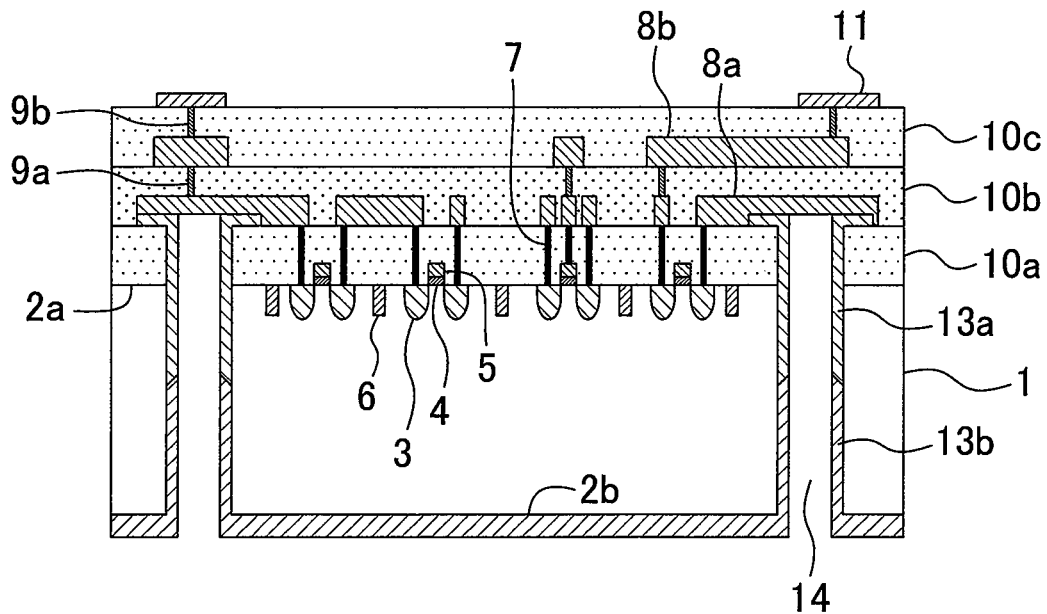
FIG. 11 is a cross-sectional view illustrating a step of a manufacturing method of a semiconductor device according to a modification of the second embodiment of the present disclosure.

Incidentally, in the present embodiment, the insulating films are formed on the inner wall of each through hole 14 in two steps. Thus, the two insulating films 13a, 13b partially overlap each other on the inner wall of each through hole 14, whereby each through hole 14, namely each through electrode, has a reduced diameter in the overlapping region. This can cause problems such as increased resistance, especially in the case of thin through electrodes. Accordingly, after the step of forming the second insulating film 13b shown in FIG. 8D, a plasma etching process or the like may be performed from the second surface 2b side to remove the protruding portions in the overlapping portion of the insulating films 13a, 13b, as shown in FIG. 11.

The present embodiment is described with respect to an example in which the nonmetal material 15 is buried in the through holes 14 in the step of FIG. 7D. However, if this step is not required, the steps of burying the nonmetal material 15 in the through holes 14 and removing the nonmetal material 15 are omitted.

The present embodiment is described with respect to an example in which the conductive portions 12 that serve as the through electrodes are connected to the first interconnects 8a. However, the present disclosure is not limited to this. The conductive portions 12 that serve as the through electrodes may be connected to interconnects of other layers such as the second interconnects 8b, and/or to the electrode pads 11. Alternatively, the conductive portions 12 may not be connected to any internal interconnect of the semiconductor device 101. Note that the manufacturing method of the semiconductor device described in the present embodiment is modified as appropriate according to the individual case. For example, the through holes 14 may be formed after forming the second interlayer insulating film 10b or the third interlayer insulating film 10c.

In the present embodiment, the selective etching process is performed in the step of FIG. 9C to thin the insulating film 13 at least around each conductive portion 12. However, if the through electrodes formed by the conductive portions 12 need not protrude from the second surface 2b side, the step of FIG. 9C may be omitted, and the lower surface of the insulating film 13 may be made flush with the bottom surfaces of the conductive portions 12.

Third Embodiment

Figure 12:
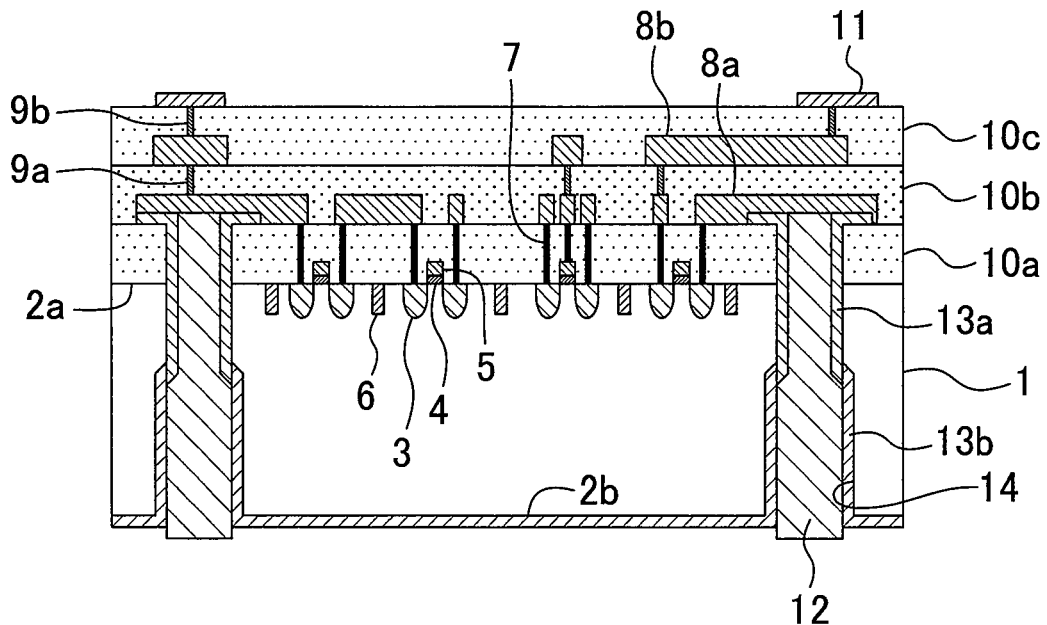
FIG. 12 is a cross-sectional view of a semiconductor device according to a third embodiment of the present disclosure.

FIG. 12 shows a cross-sectional structure of a semiconductor device 102 according to a third embodiment of the present disclosure. Note that the present embodiment is a modification of the second embodiment shown in FIG. 6, and the following description is basically the same as that of the second embodiment.

As shown in FIG. 12, impurity regions 3 of active elements such as transistors and diodes are formed in a first surface 2a (a substrate surface portion) of a semiconductor substrate 1. Gate electrodes 5 are formed on the first surface 2a of the semiconductor substrate 1 with a gate insulating film 4 interposed therebetween. Note that the active elements are electrically isolated from each other by isolation regions 6 formed in the substrate surface portion. A first interlayer insulating film 10a is formed over the first surface 2a of the semiconductor substrate 1 so as to cover the gate electrodes 5. Contacts 7, which are connected to the impurity regions 3 and the gate electrodes 5, are formed in the first interlayer insulating film 10a. A second interlayer insulating film 10b is formed over the first interlayer insulating film 10a. First interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device 102. A third interlayer insulating film 10c is formed over the second interlayer insulating film 10b. Second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device 102. Electrode pads 11 connected to the second vias 9b are formed on the third interlayer insulating film 10c, and are configured to output signals externally.

As shown in FIG. 12, through holes 14 are formed so as to extend through the semiconductor substrate 1 from the first surface 2a to a second surface 2b. The through holes 14 extend also through the first interlayer insulating film 10a. As in the second embodiment, a first insulating film 13a is formed so as to continuously extend on the inner wall of each through hole 14 and on the upper surface of the first interlayer insulating film 10a, and a second insulating film 13b is formed so as to continuously extend on the inner wall of each through hole 14 and on the second surface 2b of the semiconductor substrate 1. Note that the first insulating film 13a and the second insulating film 13b are formed so as to partially overlap each other at their ends on the inner wall of each through hole 14. A conductive portion 12, which serves as a through electrode, is formed in a space surrounded by the insulating films 13a, 13b in each through hole 14. The conductive portions 12 as the through electrodes are connected to the first interconnects 8a.

As shown in FIG. 12, the present embodiment is different from the second embodiment (see FIG. 6) in that the through holes 14 have a larger diameter in the portion where the second insulating film 13b is formed, than in the remaining portion. Thus, the first insulating film 13a and the second insulating film 13b partially overlap each other with the second insulating film 13b being located outside the first insulating film 13a.

According to the present embodiment, through electrodes having lower resistance can be formed, in addition to effects similar to those of the second embodiment. More specifically, in the second embodiment, the through holes 14 have a smaller diameter in the portion where the first insulating film 13a and the second insulating film 13b overlap each other. This can increase the resistance value of the through electrodes. However, in the present embodiment, the through holes 14 have a larger diameter in the portion where the second insulating film 13b is formed. That is, the second insulating film 13b is formed outside the first insulating film 13a. This can suppress an increase in resistance value of the through electrodes while maintaining reliability of insulation between each through electrode and the semiconductor substrate.

FIGS. 13A-13D are cross-sectional views illustrating the steps of a manufacturing method of the semiconductor device according to the third embodiment. Since many of the steps of the manufacturing method of the present embodiment are the same as those of the manufacturing method of the second embodiment, the steps different from those of the second embodiment will be described below.

First, the steps of the manufacturing method of the semiconductor device of the second embodiment shown in FIGS. 7A-7D and 8A-8C are sequentially performed.

Figure 13A:
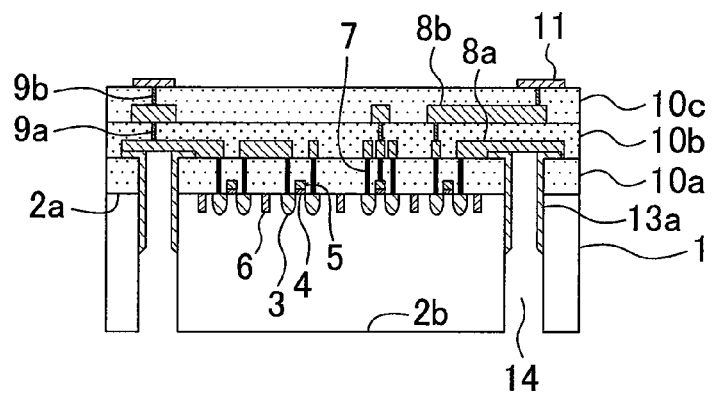
FIGS. 13A, 13B, 13C, and 13D are cross-sectional views illustrating the steps of a manufacturing method of the semiconductor device according to the third embodiment of the present disclosure.
Figure 13B:
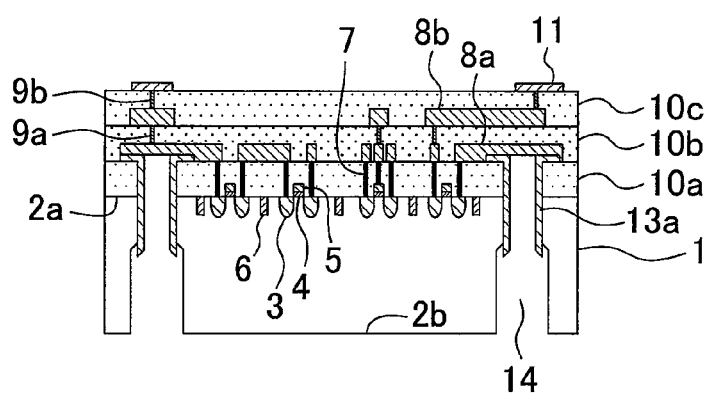

FIG. 13A shows a state where the nonmetal material 15 buried in the through holes 14 has been removed to expose the inside of each through hole 14 in the step of FIG. 8C. Then, the diameter of the through holes 14 is increased from the second surface 2b side, as shown in FIG. 13B. More specifically, for example, a resist is applied to the second surface 2b, and is patterned to remove the resist located over and around each through hole 14. By using the remaining resist as a mask, an etching process such as dry etching or wet etching is performed to increase the diameter of the through holes 14. Thus, the through holes 14 have a larger diameter on the second surface 2b side than on the first surface 2a side. Note that the etching method, which is used to increase the diameter of the through holes 14, is determined so that sufficient selectivity is obtained between the first insulating film 13a and the semiconductor substrate 1.

Figure 13C:
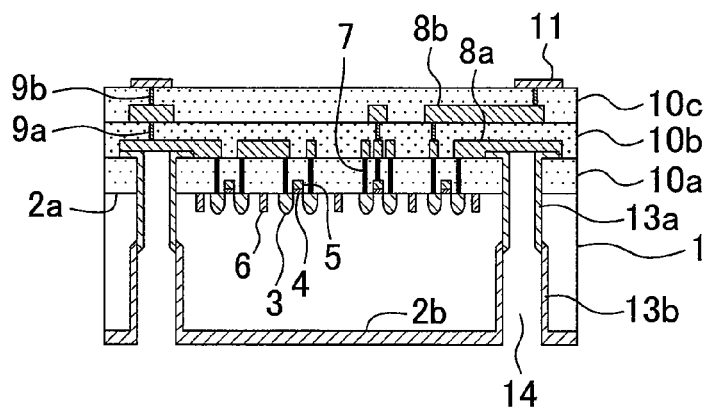

Then, as shown in FIG. 13C, a second insulating film 13b is formed on the second surface 2b and on the inner wall of each through hole 14 from the second surface 2b side. The second insulating film 13b is formed so as to continuously extend on the second surface 2b and on the inner wall of each through hole 14. The second insulating film 13b is formed under such conditions that the second insulating film 13b is formed outside the first insulating film 13a in the region where the second insulating film 13b overlaps the first insulating film 13a already formed on the inner wall of each through hole 14.

Figure 13D:
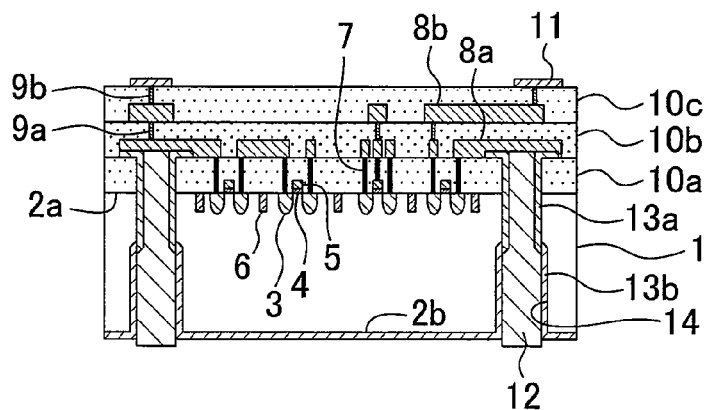

Then, steps similar to those of the manufacturing method of the second embodiment as shown in FIGS. 9A-9C are performed sequentially. That is, the conductive portions 12 are buried in the through holes 14, an unnecessary part of the conductive film is removed, and an etching process is performed so that the conductive portions 12 as the through electrodes protrude from the second surface 2b side. The structure shown in FIG. 13D is obtained in this manner.

Note that the present embodiment is described with respect to an example in which the conductive portions 12 that serve as the through electrodes are connected to the first interconnects 8a. However, the present disclosure is not limited to this. The conductive portions 12 that serve as the through electrodes may be connected to interconnects of other layers such as the second interconnects 8b, and/or to the electrode pads 11. Alternatively, the conductive portions 12 may not be connected to any internal interconnect of the semiconductor device 102. Note that the manufacturing method of the semiconductor device described in the present embodiment is modified as appropriate according to the individual case. For example, the through holes 14 may be formed after forming the second interlayer insulating film 10b or the third interlayer insulating film 10c.

Fourth Embodiment

Figure 14:
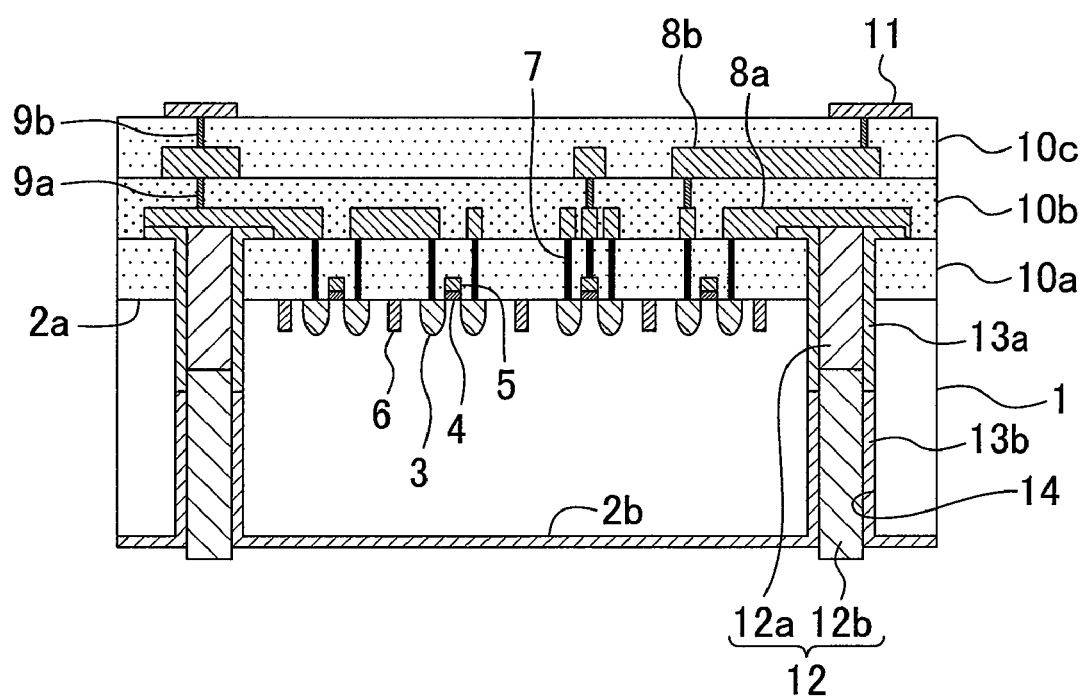
FIG. 14 is a cross-sectional view of a semiconductor device according to a fourth embodiment of the present disclosure.

FIG. 14 shows a cross-sectional structure of a semiconductor device 103 according to a fourth embodiment of the present disclosure. Note that the present embodiment is a modification of the second embodiment shown in FIG. 6, and the following description is basically the same as that of the second embodiment.

As shown in FIG. 14, impurity regions 3 of active elements such as transistors and diodes are formed in a first surface 2a (a substrate surface portion) of a semiconductor substrate 1. Gate electrodes 5 are formed on the first surface 2a of the semiconductor substrate 1 with a gate insulating film 4 interposed therebetween. Note that the active elements are electrically isolated from each other by isolation regions 6 formed in the substrate surface portion. A first interlayer insulating film 10a is formed over the first surface 2a of the semiconductor substrate 1 so as to cover the gate electrodes 5. Contacts 7, which are connected to the impurity regions 3 and the gate electrodes 5, are formed in the first interlayer insulating film 10a. A second interlayer insulating film 10b is formed over the first interlayer insulating film 10a. First interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device 103. A third interlayer insulating film 10c is formed over the second interlayer insulating film 10b. Second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device 103. Electrode pads 11 connected to the second vias 9b are formed on the third interlayer insulating film 10c, and are configured to output signals externally.

As shown in FIG. 14, through holes 14 are formed so as to extend through the semiconductor substrate 1 from the first surface 2a to a second surface 2b. The through holes 14 extend also through the first interlayer insulating film 10a. As in the second embodiment, a first insulating film 13a is formed so as to continuously extend on the inner wall of each through hole 14 and on the upper surface of the first interlayer insulating film 10a, and a second insulating film 13b is formed so as to continuously extend on the inner wall of each through hole 14 and on the second surface 2b of the semiconductor substrate 1. Note that the first insulating film 13a and the second insulating film 13b are formed so as to face each other at their ends on the inner wall of each through hole 14.

As shown in FIG. 14, the present embodiment is different from the second embodiment (see FIG. 6) in that each conductive portion 12, which serves as a through electrode, is formed by a first conductive portion 12a and a second conductive portion 12b. More specifically, the first conductive portion 12a is formed in a space surrounded by the first insulating film 13a in each through hole 14. One end of the first conductive portion 12a is connected to the first interconnect 8a, and the other end thereof is located at an intermediate depth in the through hole 14. The second conductive portion 12b is formed so as to fill the remaining void in the through hole 14, and is electrically connected to the first conductive portion 12a.

The present embodiment can provide the following effects in addition to effects similar to those of the second embodiment. In general, the higher the aspect ratio of the through holes 14 is, the more difficult it is to uniformly bury a metal in the through holes 14 without causing any undesired defects. In the present embodiment, a metal is buried in the through holes 14 in two separate steps, namely from the top of the through holes 14 and from the bottom of the through holes 14. In other words, the first conductive portion 12a is formed from the first surface 2a side (from the front side of the substrate), and the second conductive portion 12b is formed from the second surface 2b side (from the back side of the substrate). This means that the metal is buried in the through holes having an effectively lower aspect ratio as compared to conventional examples. Thus, reliable through electrodes having a smaller void can be formed even if the through holes 14 have a high aspect ratio.

FIGS. 15A-15D and 16A-16C are cross-sectional views illustrating the steps of a manufacturing method of the semiconductor device according to the fourth embodiment. Since many of the steps of the manufacturing method of the present embodiment are the same as those of the manufacturing method of the second embodiment, the steps different from those of the second embodiment will be described below.

First, the steps of the manufacturing method of the semiconductor device of the second embodiment shown in FIGS. 7A-7C are sequentially performed.

Figure 15A:
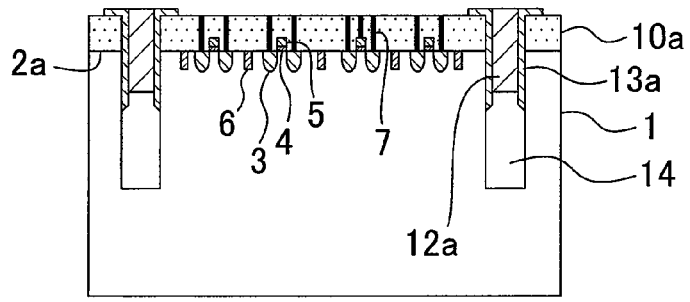
FIGS. 15A, 15B, 15C, and 15D are cross-sectional views illustrating the steps of a manufacturing method of the semiconductor device according to the fourth embodiment of the present disclosure.

Then, as shown in FIG. 15A, a first conductive portion 12a is formed in a space surrounded by the first insulating film 13a in each through hole 14. More specifically, a conductive film, which serves as the first conductive portion 12a, is formed from the first surface 2a side (from the first interlayer insulating film 10a side) to a depth within the range in which the first insulating film 13a is formed in each through hole 14. The first conductive portions 12a are made of, e.g., Cu, W, Al, or polysilicon. Note that a protective film for preventing diffusion of the material of the first conductive portion 12a is preferably formed between the first conductive portion 12a and the first insulating film 13a in each through hole 14. The protective film is preferably made of a material having a barrier property, such as, e.g., Ta, TaN, TiN, or the like.

In the present embodiment, the first conductive portion 12a is formed in the space surrounded by the first insulating film 13a in each through hole 14. Thus, when forming internal interconnects of the semiconductor device above the through holes 14 in a later step, the possibility that an interlayer film material and/or an interconnect film material may enter the through holes 14 and cause defects can be reduced or eliminated without burying the nonmetal material 15 in the through holes 14 (i.e., without performing the steps of burying the nonmetal material 15 in the through holes 14 and removing the nonmetal material 15) as in the second embodiment.

Figure 15B:
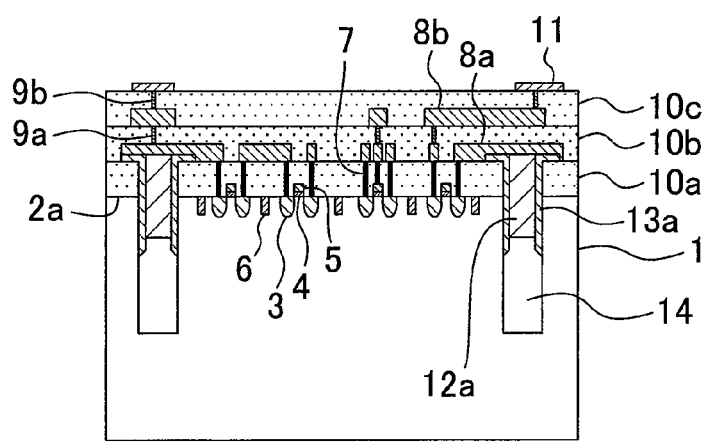
Figure 15C:
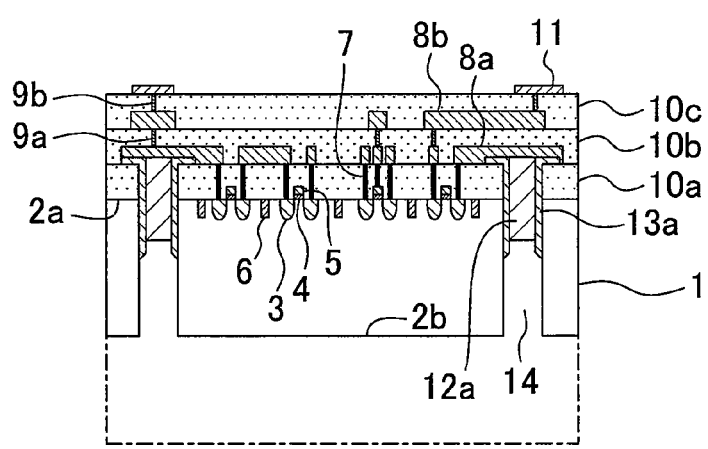
Figure 15D:
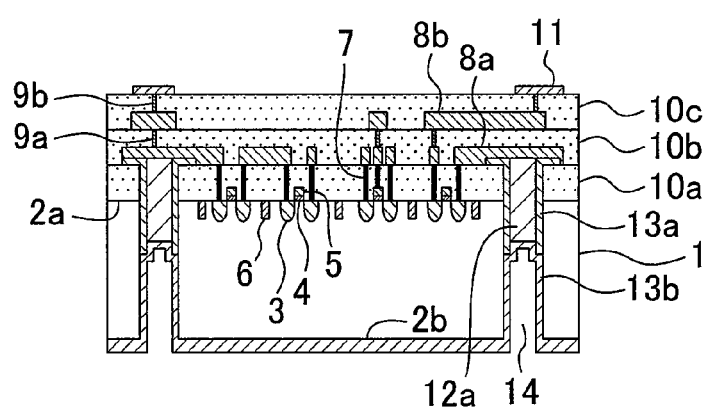

Then, the steps of the manufacturing method of the second embodiment shown in FIGS. 8A-8D are sequentially performed. First, internal interconnects of the semiconductor device are formed as shown in FIG. 15B. At this time, first interconnects 8a are formed so as to cover the through holes 14 having the first conductive portion 12a buried to the intermediate depth therein. Then, as shown in FIG. 15C, the semiconductor substrate 1 is thinned from the surface opposite to the first surface 2a. Subsequently, as shown in FIG. 15D, a second insulating film 13b is formed from the second surface 2b side. The second surface 2b is a surface of the semiconductor substrate 1, which is formed by the substrate thinning step of FIG. 15C. In the step of FIG. 15D, the second insulating film 13b is formed on the second surface 2b, on the inner wall of each through hole 14 (including on the first insulating film 13a), and on the bottom surface of each first conductive portion 12a. The second insulating film 13b continuously extends on the second surface 2b and on the inner wall of each through hole 14.

Figure 16A:
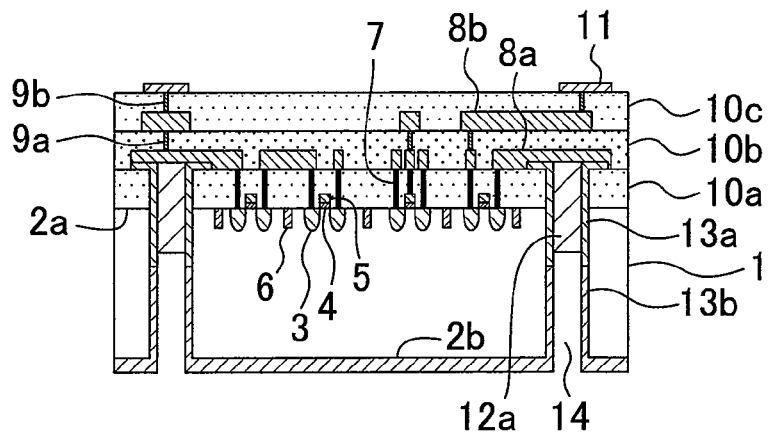
FIGS. 16A, 16B, and 16C are cross-sectional views illustrating the steps of the manufacturing method of the semiconductor device according to the fourth embodiment of the present disclosure.

Then, as shown in FIG. 16A, the second insulating film 13b is removed from the bottoms of the first conductive portions 12a to expose the bottoms of the first conductive portions 12a.

Figure 16B:
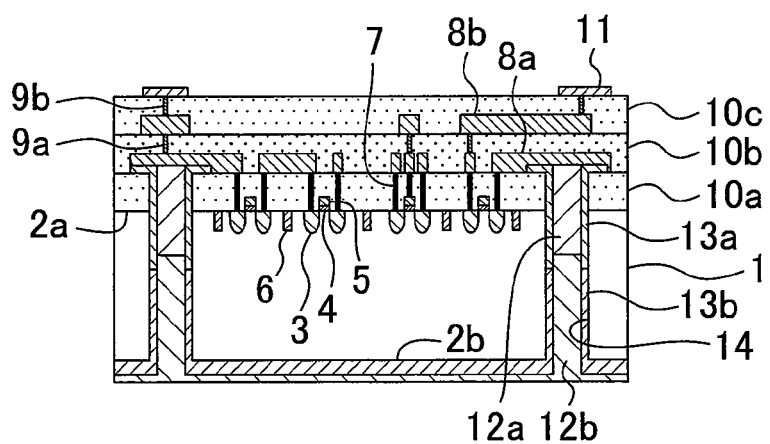
Figure 16C:
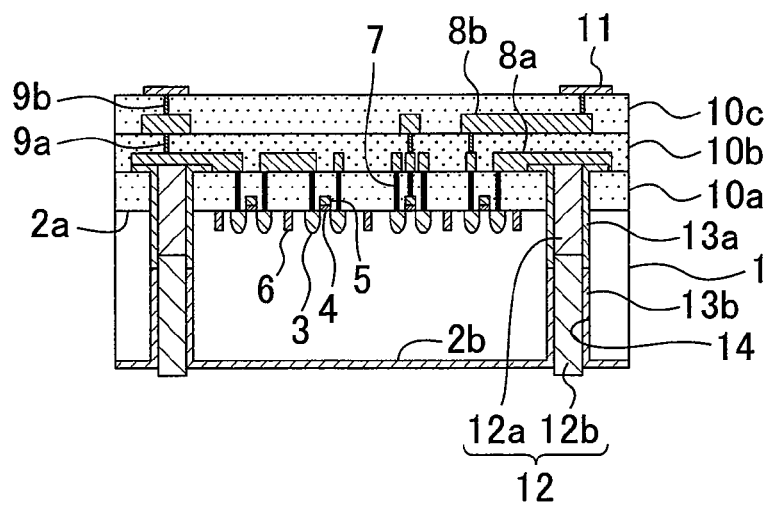

Thereafter, steps similar to those of the manufacturing method of the second embodiment shown in FIGS. 9A-9C are sequentially performed. More specifically, as shown in FIG. 16B, a second conductive portion 12b is buried in the remaining void of each through hole 14 so as to be in contact with the first conductive portion 12a, thereby forming conductive portions 12. Each conductive portion 12 is formed by the first and second conductive portions 12a, 12b and serves as a through electrode. The conductive portions 12b are made of, e.g., Cu, W, Al, or polysilicon. Note that a protective film for preventing diffusion of the material of the second conductive portion 12b is preferably formed between the second conductive portion 12b and the insulating films 13a, 13b in each through hole 14. The protective film is preferably made of a material having a barrier property, such as, e.g., Ta, TaN, TiN, or the like. Thereafter, although not shown in the figures, an unnecessary part of the conductive film is removed, and the second insulating film 13b is etched back so that the conductive portions 12 serving as the through electrodes protrude from the second surface 2b side. The structure shown in FIG. 16C is obtained in this manner.

Note that the present embodiment is described with respect to an example in which the conductive portions 12 that serve as the through electrodes are connected to the first interconnects 8a. However, the present disclosure is not limited to this. The conductive portions 12 that serve as the through electrodes may be connected to interconnects of other layers such as the second interconnects 8b, and/or to the electrode pads 11. Alternatively, the conductive portions 12 may not be connected to any internal interconnect of the semiconductor device 103. Note that the manufacturing method of the semiconductor device described in the present embodiment is modified as appropriate according to the individual case. For example, the through holes 14 may be formed after forming the second interlayer insulating film 10*b* or the third interlayer insulating film 10*c*.

Fifth Embodiment

Figure 17:
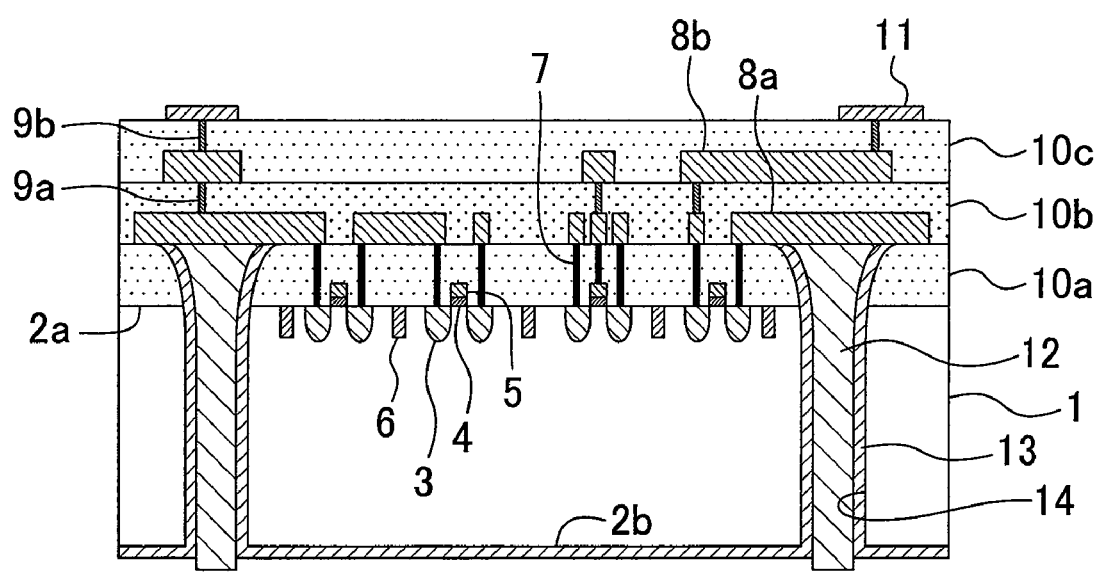
FIG. 17 is a cross-sectional view of a semiconductor device according to a fifth embodiment of the present disclosure.

FIG. 17 shows a cross-sectional structure of a semiconductor device 104 according to a fifth embodiment of the present disclosure. As shown in FIG. 17, impurity regions 3 of active elements such as transistors and diodes are formed in a first surface 2*a* (a substrate surface portion) of a semiconductor substrate 1. Gate electrodes 5 are formed on the first surface 2*a* of the semiconductor substrate 1 with a gate insulating film 4 interposed therebetween. Note that the active elements are electrically isolated from each other by isolation regions 6 formed in the substrate surface portion. A first interlayer insulating film 10*a* is formed over the first surface 2*a* of the semiconductor substrate 1 so as to cover the gate electrodes 5. Contacts 7, which are connected to the impurity regions 3 and the gate electrodes 5, are formed in the first interlayer insulating film 10*a*. A second interlayer insulating film 10*b* is formed over the first interlayer insulating film 10*a*. First interconnects 8*a* connected to the contacts 7, and first vias 9*a* connected to the first interconnects 8*a* are formed in the second interlayer insulating film 10*b*. The first interconnects 8*a* are configured to transmit signals and supply a power supply voltage within the semiconductor device 104. A third interlayer insulating film 10*c* is formed over the second interlayer insulating film 10*b*. Second interconnects 8*b* connected to the first vias 9*a*, and second vias 9*b* connected to the second interconnects 8*b* are formed in the third interlayer insulating film 10*c*. The second interconnects 8*b* are configured to transmit signals and supply a power supply voltage within the semiconductor device 104. Electrode pads 11 connected to the second vias 9*b* are formed on the third interlayer insulating film 10*c*, and are configured to output signals externally.

As shown in FIG. 17, through holes 14 are formed so as to extend through the semiconductor substrate 1 from the first surface 2*a* to a second surface 2*b*. An insulating film 13 is formed on the inner wall of each through hole 14. A conductive portion 12, which serves as a through electrode, is formed in a space surrounded by the insulating film 13 in each through hole 14.

Note that in the present embodiment, the through holes 14 extend also through the first interlayer insulating film 10*a*, and the conductive portions 12, which serve as the through electrodes, are connected to the first interconnects 8*a*. The diameter of the through holes 14 increases toward the upper surface of the first interlayer insulating film 10*a* only in a region near the upper surface of the first interlayer insulating film 10*a* (e.g., to a depth of up to about 200 nm from the upper surface of the first interlayer insulating film 10*a*). The diameter of the through holes 14 is substantially constant in the semiconductor substrate 1. That is, most of the inner wall of each through hole 14 is perpendicular to the second surface 2*b*.

A feature of the present embodiment is that the insulating film 13, which is formed on the inner wall of each through hole 14, continuously extends on the second surface 2*b*.

According to this feature, the insulating film formed on the second surface 2*b*, namely on the back surface of the substrate, and the insulating film formed on the inner wall of each through hole 14 together form the continuous film 13. This can reliably reduce or eliminate the possibility of short-circuits between the semiconductor substrate 1 and the through electrodes (the conductive portions 12) exposed from the back surface of the substrate, as compared to the conventional structures in which these insulating films are separate films and there is a joint therebetween. This increases reliability of insulation between the through electrode and the substrate around each through electrode at the second surface 2*b*, whereby a semiconductor device having more reliable through electrodes can be implemented.

According to the present embodiment, most of the inner wall of each through hole 14 is perpendicular to the second surface 2*b*, and the through holes 14, namely the through electrodes, have a relatively large diameter only within the first interlayer insulating film 10*a*. Thus, the area occupied by the through electrodes in the semiconductor substrate 1 can be reduced as compared to the case where the through electrodes have a reverse tapered shape, whereby the size of the semiconductor device 104 can be efficiently reduced. The through electrodes have a relatively large diameter on the first interlayer insulating film 10*a* side, namely near the location where the through electrodes are connected to the internal interconnects of the semiconductor device. Thus, the contact resistance between the through electrode and the interconnect can be reduced by making the dimensions of the interconnects, which are connected to the through electrodes, larger than those of the through electrodes.

FIGS. 18A-18D, 19A-19D, and 20A-20C are cross-sectional views illustrating the steps of a manufacturing method of the semiconductor device according to the fifth embodiment.

Figure 18A:
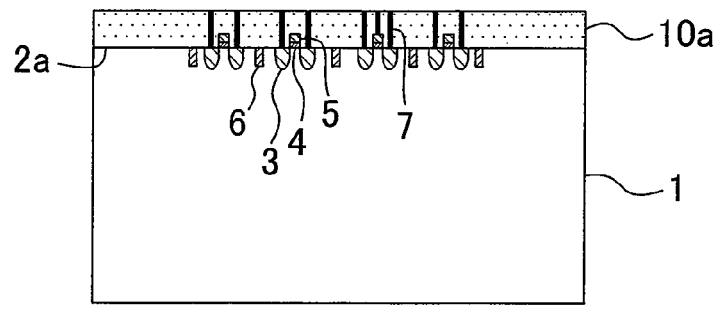
FIGS. 18A, 18B, 18C, and 18D are cross-sectional views illustrating the steps of the manufacturing method of the semiconductor device according to the fifth embodiment of the present disclosure.

First, as shown in FIG. 18A, impurity regions 3 of active elements such as transistors and diodes, and isolation regions 6 for electrically isolating the active elements from each other are formed in a first surface 2*a* (a substrate surface portion) of a semiconductor substrate 1. Then, gate electrodes 5 are formed on the first surface 2*a* of the semiconductor substrate 1 with a gate insulating film 4 interposed therebetween, and a first interlayer insulating film 10*a* is formed so as to cover the gate electrodes 5. Thereafter, contacts 7, which are connected to the impurity regions 3 and the gate electrodes 5, are formed in the first interlayer insulating film 10*a*.

Figure 18B:
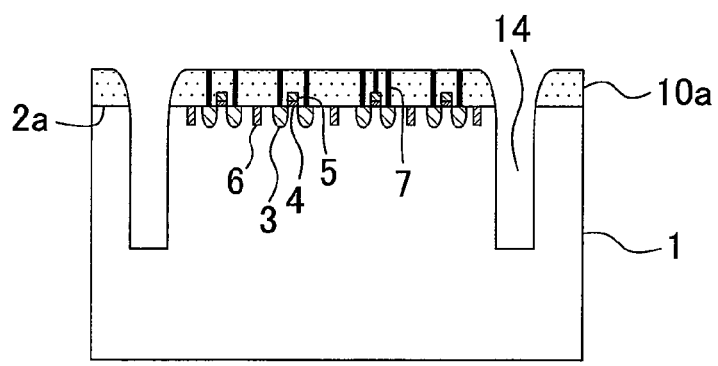

Then, as shown in FIG. 18B, through holes 14 are formed so as to extend through the first interlayer insulating film 10*a* to an intermediate depth in the semiconductor substrate 1. The through holes 14 may be formed so as to extend to a second surface 2*b*, which is an opposite surface of the semiconductor substrate 1. However, in the present embodiment, formation of the through holes 14 is terminated at the intermediate depth in the semiconductor substrate 1 according to a final required depth. No through hole 14 is formed in the regions where the active elements are formed. The through holes 14 are formed by a known technique. For example, the through holes 14 may be formed by a lithography technique and an etching technique. More specifically, a patterned resist (not shown) may be formed by a lithography technique, and the through holes 14 may be formed by an etching technique such as dry etching or wet etching by using the patterned resist as a mask. Alternatively, the through holes 14 may be formed by using a laser (e.g., a $CO_2$ laser or a YAG laser). Note that in the present embodiment, the diameter of the through holes 14 increases toward the upper surface of the first interlayer insulating film 10*a* only in a region near the upper surface of the first interlayer insulating film 10*a* (e.g., to a depth of up to about 200 nm from the upper surface of the first interlayer insulating film 10*a*). The diameter of the through holes 14 is substantially constant in the semiconductor substrate 1. Specifically, the through holes 14 have a diameter of, e.g., about 0.5 to 25 μm near the upper surface of the first interlayer insulating film 10*a*, and has a diameter of, e.g., about 0.1 to 20 µm in the semiconductor substrate 1. The depth of the through holes 14 is about 5 to 50 µm.

Figure 18C:
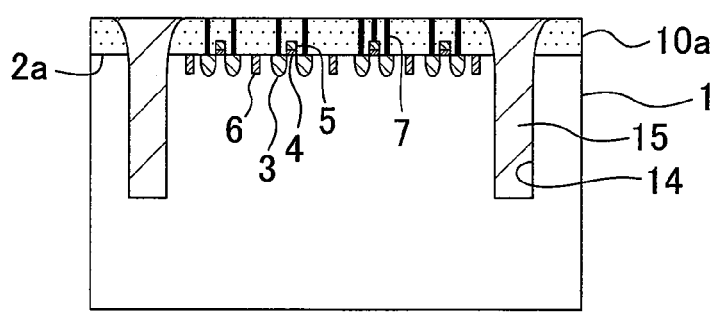

Then, as shown in FIG. 18C, a nonmetal material 15 is buried in the through holes 14. The nonmetal material 15 is desirably a material that can be easily removed later. For example, an organic material such as a resist material is desirable as the nonmetal material 15. It should be noted that a conductive material such as a conductive polymer may be used as the nonmetal material 15 as long as it does not diffuse into the semiconductor substrate 1 and can be easily removed later. The nonmetal material 15 can be buried in the through holes 14 by, e.g., a spin coating method or a spray method.

Burying the nonmetal material 15 in the through holes 14 in this manner can reduce or eliminate the possibility that an interlayer film material and/or an interconnect material may enter the through holes 14 and cause defects when forming internal interconnects of the semiconductor device above the through holes 14 in a later step. Burying the nonmetal material 15 in the through holes 14 can also avoid or reduce problems such as chipping in the through holes 14, since the nonmetal material 15 is simultaneously ground or the like together with the substrate in a substrate thinning step that is performed later.

Figure 18D:
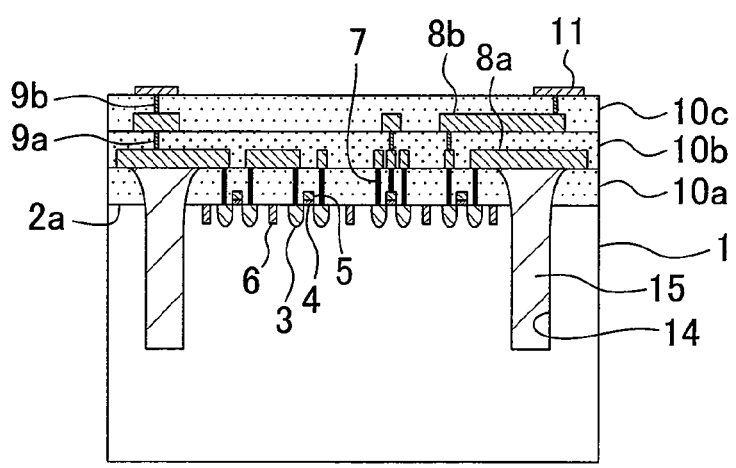

Then, as shown in FIG. 18D, a second interlayer insulating film 10b is formed over the first interlayer insulating film 10a. Thereafter, first interconnects 8a connected to the contacts 7, and first vias 9a connected to the first interconnects 8a are formed in the second interlayer insulating film 10b. The first interconnects 8a are configured to transmit signals and supply a power supply voltage within the semiconductor device. The first interconnects 8a are formed so as to cover the through holes 14 having the nonmetal material 15 buried therein. Then, a third interlayer insulating film 10c is formed over the second interlayer insulating film 10b. Thereafter, second interconnects 8b connected to the first vias 9a, and second vias 9b connected to the second interconnects 8b are formed in the third interlayer insulating film 10c. The second interconnects 8b are configured to transmit signals and supply a power supply voltage within the semiconductor device. Then, electrode pads 11 connected to the second vias 9b are formed on the third interlayer insulating film 10c, and are configured to output signals externally.

Note that although FIG. 18D shows an example of forming a two-layer interconnect structure, the number of interconnect layers can be changed as needed, and the present disclosure is not limited to the two-layer interconnect structure.

Figure 19A:
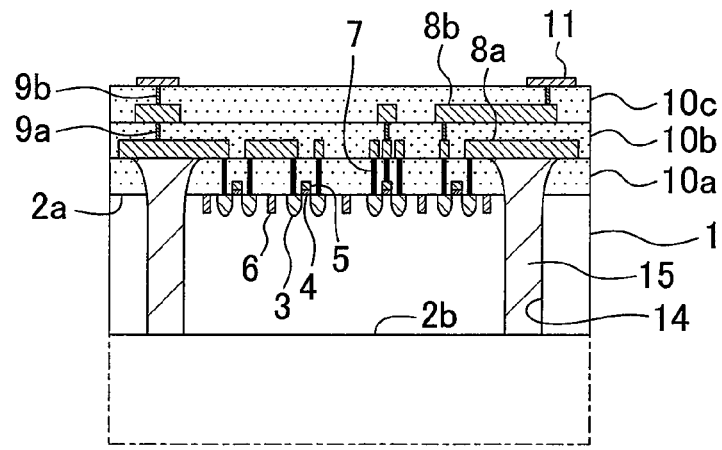
FIGS. 19A, 19B, 19C, and 19D are cross-sectional views illustrating the steps of the manufacturing method of the semiconductor device according to the fifth embodiment of the present disclosure.

Then, as shown in FIG. 19A, the semiconductor substrate 1 is thinned from the surface opposite to the first surface 2a. For example, the semiconductor substrate 1 can be thinned by a method such as, e.g., mechanical grinding/polishing or chemical grinding/polishing. In the present embodiment, the semiconductor substrate 1 is thinned to a final thickness of about 5 to 150 µm, thereby exposing the bottoms of the through holes 14.

Note that in the substrate thinning step, the smaller the final substrate thickness is, the more fragile the substrate becomes, and the more the substrate tends to crack or fracture or the like. In order to prevent this problem, the substrate may be reinforced by bonding the upper surface of the semiconductor device to a support substrate in the substrate thinning step.

Figure 19B:
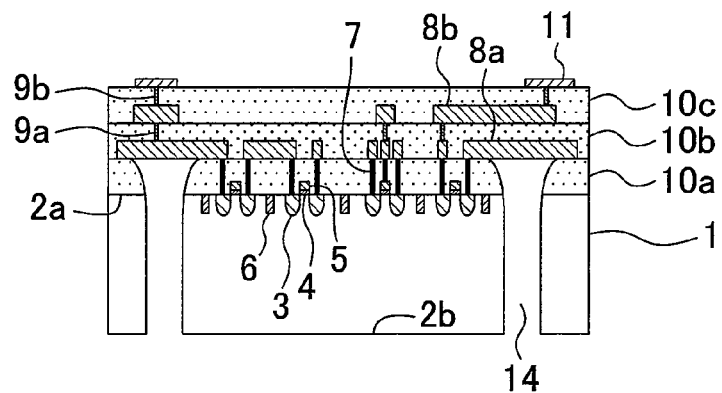

Then, as shown in FIG. 19B, the nonmetal material 15 buried in the through holes 14 is removed from the second surface 2b side to expose the inside of each through hole 14. The second surface 2b is a surface of the semiconductor substrate 1, which is formed by the substrate thinning step. The nonmetal material 15 is removed by an optimal method that is determined according to the type of the nonmetal material 15. For example, the nonmetal material 15 can be removed by a method using a chemical, or by thermal sublimation, plasma ashing, or the like.

Figure 19C:
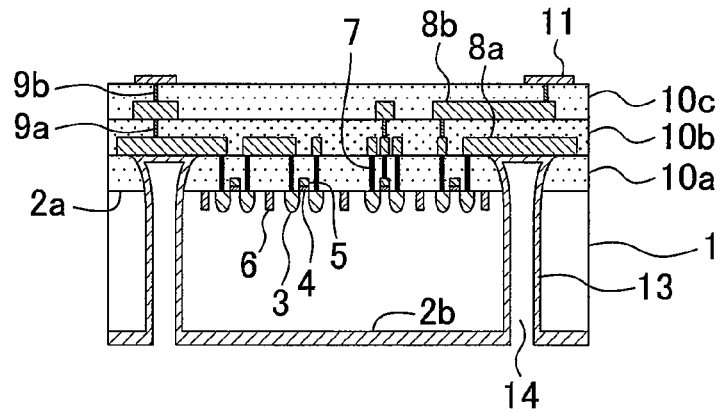

Then, as shown in FIG. 19C, an insulating film 13 is formed from the second surface 2b side. The insulating film 13 is formed on the second surface 2b, on the inner walls of the through holes 14, and on the lower surfaces of the first interconnects 8a that cover the through holes 14. The insulating film 13 may be made of, e.g., $SiO_2$, SiN, or the like. In another possible method of forming the insulating film 13, a resist is formed in advance by a known technique such as photolithography, on the second surface 2b so as to cover those regions where the insulating film 13 should not be formed. Then, the insulating film 13 is formed, and the insulating film 13 in these regions is removed together with the underlying resist.

Figure 19D:
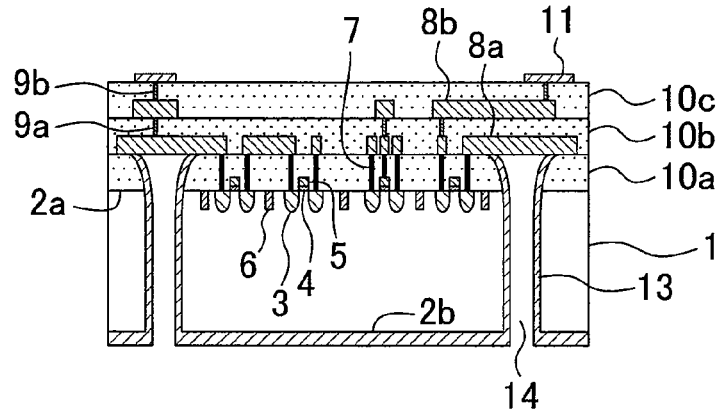

Then, as shown in FIG. 19D, the insulating film 13 is removed from the lower surfaces of the first interconnects 8a that cover the through holes 14, by a method such as dry etching, wet etching, or the like.

Figure 20A:
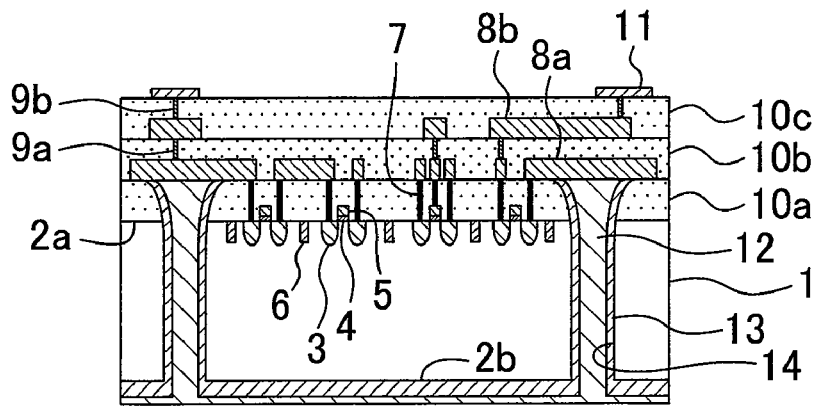
FIGS. 20A, 20B, and 20C are cross-sectional views illustrating the steps of the manufacturing method of the semiconductor device according to the fifth embodiment of the present disclosure.

Thereafter, as shown in FIG. 20A, a conductive portion 12 is formed in a space surrounded by the insulating film 13 in each through hole 14. More specifically, a conductive film, which serves as the conductive portions 12, is formed from the second surface 2b side so as to fill the through holes 14. The conductive portions 12 are made of, e.g., Cu, W, Al, or polysilicon. Note that a protective film for preventing diffusion of the material of the conductive portion 12 is preferably formed between the conductive portion 12 and the insulating film 13 in each through hole 14. The protective film is preferably made of a material having a barrier property, such as, e.g., Ta, TaN, TiN, or the like.

Figure 20B:
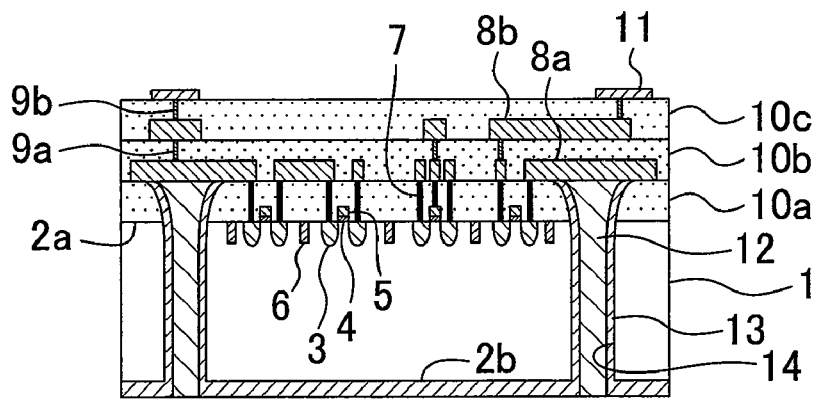

Then, as shown in FIG. 20B, an unnecessary part of the conductive film is removed by a method such as chemical polishing/grinding, mechanical polishing/grinding, or the like. More specifically, the conductive film, which is formed in the step of burying the conductive portions 12, namely through electrodes, is partially removed so as to leave only those portions which serve as the through electrodes.

Figure 20C:
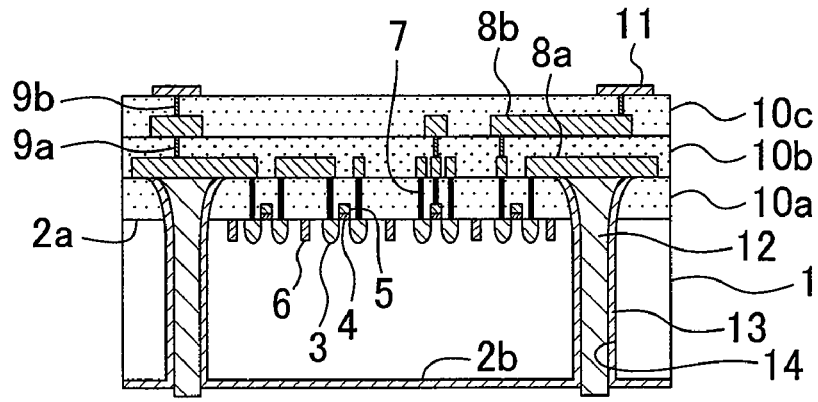
Figure 21:
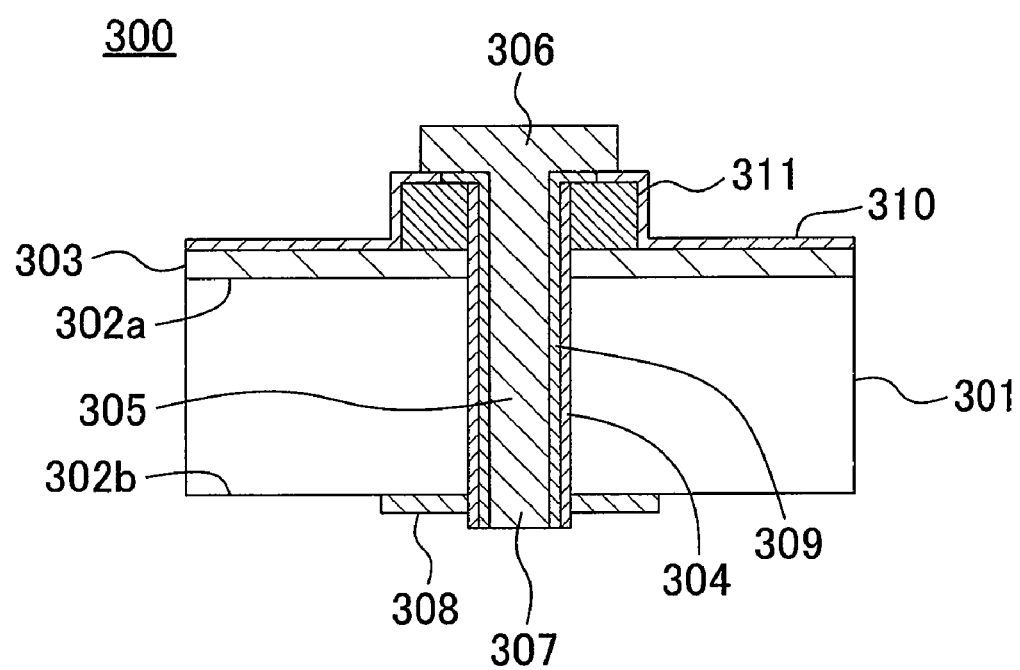
FIG. 21 is a cross-sectional view showing the structure around a through electrode in a conventional semiconductor device disclosed in Japanese Published Patent Application No. 2005-12023.

Then, as shown in FIG. 20C, the insulating film 13 is selectively etched and thinned at least around each through electrode so that the through electrodes, formed by the conductive portions 12, protrude from the second surface 2b side. This etching method may be either dry etching or wet etching.

According to the semiconductor device of the present embodiment formed as described above, a stacked semiconductor device can be implemented by bonding the protruding portions of the conductive portions 12 at the second surface 2b and electrode pads of another semiconductor device together via solder bumps or by directly bonding the metals, or the like. Thus, the semiconductor devices can be connected together with the smallest gap therebetween, and the area of the stacked semiconductor device can be reduced as compared to conventional stacked semiconductor devices using wire bonding, by an amount corresponding to the region for extending the wires. As a result, a smaller stacked semiconductor device can be implemented.

According to the present embodiment, since the insulating film 13 is formed in advance on the second surface 2b of the semiconductor device 104, no additional insulating film for insulating the semiconductor device 104 from another semiconductor device to be stacked thereon is required to form a stacked semiconductor device as described above. Moreover, since the insulating film 13 is formed in advance on the second surface 2b of the semiconductor device 104, a material having low moisture resistance, such as, e.g., polyimide, can be used as a filling material for filling the gap between the semiconductor devices, thereby increasing the range of selection of the material.

Note that the present embodiment is described with respect to an example in which the nonmetal material 15 is buried in the through holes 14 in the step of FIG. 18C. However, if this step is not required, the steps of burying the nonmetal material 15 in the through holes 14 and removing the nonmetal material 15 are omitted.

The present embodiment is described with respect to an example in which the conductive portions 12 that serve as the through electrodes are connected to the first interconnects 8a. However, the present disclosure is not limited to this. The conductive portions 12 that serve as the through electrodes may be connected to interconnects of other layers such as the second interconnects 8b, and/or the electrode pads 11. Alternatively, the conductive portions 12 may not be connected to any internal interconnect of the semiconductor device 104. Note that the manufacturing method of the semiconductor device described in the present embodiment is modified as appropriate according to the individual case. For example, the through holes 14 may be formed after forming the second interlayer insulating film 10b or the third interlayer insulating film 10c.

In the present embodiment, the selective etching process is performed in the step of FIG. 20C to thin the insulating film 13 at least around each conductive portion 12. However, if the through electrodes formed by the conductive portions 12 need not protrude from the second surface 2b side, the step of FIG. 20C may be omitted, and the lower surface of the insulating film 13 may be made flush with the bottom surfaces of the conductive portions 12.

The present disclosure is described above based on its preferred embodiments. However, it should be understood that the present disclosure is not limited to the above embodiments, and combinations of the embodiments are also included in the scope of the present disclosure.

What is claimed is:

1. A semiconductor device, comprising:
    a semiconductor substrate having a first surface as a surface on which an element is formed, and a second surface opposite to the first surface;
    a through hole formed so as to extend through the semiconductor substrate from the first surface to the second surface;
    an insulating film formed on an inner wall of the through hole; and
    a conductive portion formed in a space surrounded by the insulating film in the through hole, wherein
    the insulating film continuously extends on the inner wall of the through hole and on the second surface, and
    the part of the conductive portion exposed at the second surface does not extend on a region of the insulating film located on the second surface.

2. The semiconductor device of claim 1, wherein a diameter of the through hole decreases in a direction from the first surface toward the second surface, and the through hole has a smallest diameter at the second surface.

3. The semiconductor device of claim 1, wherein the through hole has a larger diameter only in a portion near the first surface than in a remaining portion.

4. The semiconductor device of claim 1, wherein the through hole has a larger diameter on the second surface side than on the first surface side.

5. The semiconductor device of claim 1, wherein the insulating film continuously extends on the inner wall of the through hole and on the first surface.

6. The semiconductor device of claim 1, wherein
    the insulating film is formed by a first insulating film and a second insulating film, and
    the second insulating film continuously extends on the inner wall of the through hole and on the second surface.

7. The semiconductor device of claim 6, wherein the first insulating film continuously extends on the inner wall of the through hole and on the first surface.

8. The semiconductor device of claim 6, wherein the conductive portion is formed by a first conductive portion and a second conductive portion.

9. The semiconductor device of claim 8, wherein the first conductive portion is formed in a space surrounded by the first insulating film in the through hole.

10. The semiconductor device of claim 1, wherein the conductive portion protrudes from the second surface side.

11. The semiconductor device of claim 1, wherein
    an interlayer insulating film is formed over the first surface of the semiconductor substrate, and
    the through hole is formed also in the interlayer insulating film.

12. The semiconductor device of claim 1, wherein
    an interconnect is formed over the first surface of the semiconductor substrate, and
    the conductive portion and the interconnect are connected together.

13. The semiconductor device of claim 1, wherein the part of the conductive portion exposed at the second surface protrudes from the region of the insulating film located on the second surface.

14. The semiconductor device of claim 1, wherein the conductive portion disposed in the through hole contacts the insulating film formed on the inner wall of the through hole.

15. A method for manufacturing a semiconductor device, comprising the steps of:
    (a) forming a through hole so that the through hole extends through a semiconductor substrate that has a first surface as a surface on which an element is formed, and a second surface opposite to the first surface;
    (b) forming an insulating film so that the insulting film continuously extends on an inner wall of the through hole and on the second substrate; and
    (c) forming a conductive portion in a space surrounded by the insulating film in the through hole, wherein
    the part of the conductive portion exposed at the second surface does not extend on a region of the insulating film located on the second surface.

16. The method of claim 15, wherein the step (b) includes the step of forming the insulating film on the second surface and on the inner wall of the through hole from the second surface side.

17. The method of claim 16, wherein the step (a) includes the step of forming the through hole so that a diameter of the through hole decreases in a direction from the first surface toward the second surface, and that the through hole has a smallest diameter at the second surface.

18. The method of claim 16, wherein the step (a) includes the step of forming the through hole so that the through hole has a larger diameter only in a portion near the first surface than in a remaining portion.

19. The method of claim 16, wherein
    the step (a) includes the steps of
        (a1) forming, from the first surface side, the through hole so that the through hole extends to an intermediate depth in the semiconductor substrate, and (a2) thinning the semiconductor substrate from the second surface side to expose a bottom of the through hole, the method further comprising the steps of:
(d) burying a nonmetal material in the through hole between the steps (a1) and (a2); and
(e) removing the nonmetal material from the through hole between the steps (a2) and (b).

20. The method of claim 15, wherein
the step (a) includes the steps of:
   (a1) forming, from the first surface side, the through hole so that the through hole extends to an intermediate depth in the semiconductor substrate, and
   (a2) thinning the semiconductor substrate from the second surface side to expose a bottom of the through hole, the method further comprising the step of:
(f) forming, from the first surface side, a first insulating film on the first surface and on the inner wall of the through hole between the steps (a1) and (a2), and
the step (b) includes the step of forming, from the second surface side, a second insulating film on the second surface and on the inner wall of the through hole so that the second insulating film is in contact with the first insulating film, thereby forming the insulating film that is formed by the first insulating film and the second insulating film.

21. The method of claim 20, further comprising the step of:
(g) increasing a diameter of the through hole from the second surface side between the steps (a2) and (b).

22. The method of claim 20, further comprising the steps of:
(h) burying a nonmetal material in the through hole between the steps (f) and (a2); and
(i) removing the nonmetal material from the through hole between the steps (a2) and (b).

23. The method of claim 20, further comprising the step of:
(j) forming a first conductive portion in a space surrounded by the first insulating film in the through hole between the steps (f) and (a2), wherein
the step (c) includes the step of forming a second conductive portion in the space surrounded by the insulating film in the through hole, so that the second conductive portion is in contact with the first conductive portion, thereby forming the conductive portion that is formed by the first conductive portion and the second conductive portion.

* * * * *